(12) United States Patent
Wei

(10) Patent No.: US 8,165,854 B1
(45) Date of Patent: Apr. 24, 2012

(54) COMPUTER SIMULATION OF PHOTOLITHOGRAPHIC PROCESSING

(75) Inventor: Haiqing Wei, San Jose, CA (US)

(73) Assignee: Olambda, Inc., Los Altos, CA (US)

(*) Notice: Subject to any disclaimer, the term of this patent is extended or adjusted under 35 U.S.C. 154(b) by 873 days.

(21) Appl. No.: 12/169,040

(22) Filed: Jul. 8, 2008

Related U.S. Application Data

(63) Continuation-in-part of application No. 11/708,444, filed on Feb. 20, 2007, now abandoned, which is a continuation of application No. 11/331,223, filed on Jan. 11, 2006, now abandoned, and application No. 12/169,040.

(60) Provisional application No. 60/948,467, filed on Jul. 8, 2007.

(51) Int. Cl.
*G06F 7/60* (2006.01)

(52) U.S. Cl. .......................................................... 703/2

(58) Field of Classification Search ... 703/2; 702/94–95
See application file for complete search history.

(56) References Cited

U.S. PATENT DOCUMENTS

| | | | |
|---|---|---|---|
| 6,728,937 B2 | 4/2004 | Wakita et al. | |
| 7,228,005 B1* | 6/2007 | Yuan ............................. | 382/280 |
| 7,266,800 B2 | 9/2007 | Sezginer | |
| 7,933,471 B2* | 4/2011 | Li et al. ......................... | 382/279 |
| 2004/0133871 A1 | 7/2004 | Granik et al. | |
| 2005/0015233 A1 | 1/2005 | Gordon | |
| 2005/0114822 A1 | 5/2005 | Axelrad et al. | |
| 2005/0114823 A1* | 5/2005 | Kuchler et al. ................. | 716/21 |
| 2005/0185159 A1 | 8/2005 | Rosenbluth et al. | |
| 2005/0204322 A1 | 9/2005 | Kotani et al. | |
| 2005/0216877 A1 | 9/2005 | Pack et al. | |
| 2005/0229125 A1 | 10/2005 | Tabery et al. | |
| 2006/0034505 A1 | 2/2006 | Luk-Pat et al. | |
| 2006/0269875 A1 | 11/2006 | Granik | |

(Continued)

FOREIGN PATENT DOCUMENTS

WO    WO2005/098686 A2    10/2005

OTHER PUBLICATIONS

Cobb, Nicolas Bailey. "Fast Optical and Process Proximity Correction Algorithms for Integrated Circuit Manufactoring," Ph.D. Dissertation, University of California at Berkeley, 1998.

(Continued)

*Primary Examiner* — Paul Rodriguez
*Assistant Examiner* — Eunhee Kim
(74) *Attorney, Agent, or Firm* — Cooper & Dunham, LLC

(57) ABSTRACT

Methods, systems, and related computer program products for photolithographic process simulation are disclosed. In one preferred embodiment, a resist processing system is simulated according to a Wiener nonlinear model thereof in which a plurality of precomputed optical intensity distributions corresponding to a respective plurality of distinct elevations in an optically exposed resist film are received, each optical intensity distribution is convolved with each of a plurality of predetermined Wiener kernels to generate a plurality of convolution results, and at least two of the convolution results are multiplied to produce at least one cross-product. A weighted summation of the plurality of convolution results and the at least one cross-product is computed using a respective plurality of predetermined Wiener coefficients to generate a Wiener output, and a resist processing system simulation result is generated based at least in part on the Wiener output.

46 Claims, 20 Drawing Sheets

U.S. PATENT DOCUMENTS

2007/0028206 A1* 2/2007 Chou et al. .................... 716/21
2007/0198963 A1   8/2007 Granik et al.
2008/0059128 A1   3/2008 Tejnil
2008/0134131 A1   6/2008 Asano et al.

OTHER PUBLICATIONS

Shi, Xuelong, et al. "Eigen Decomposition Based Models for Model OPC," Proceedings of SPIE vol. 5446, pp. 462-470, 2004.

Martin, Patrick et al. "Exploring new high speed, mask aware RET verification flows," Proceedings of SPIE vol. 5853, pp. 114-123, 2005.

Pati, Y.C., et al. "Exploiting Structure in Fast Aerial Image Computation for Integrated Circuit Patterns," *IEEE Transactions on Semiconductor Manufactoring*, vol. 10, No. 1, pp. 62-74, Feb. 2007.

Schetzen, Martin. "Nonlinear System Modeling Based on the Wiener Theory", *Proceedings of the IEEE*, vol. 69, No. 12, Dec. 1981.

* cited by examiner

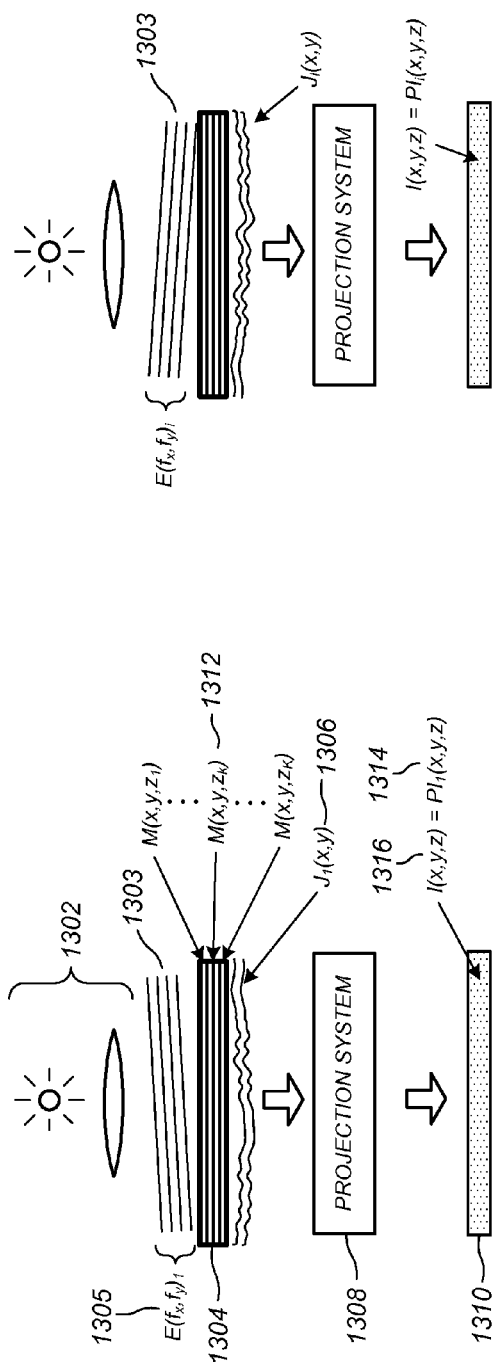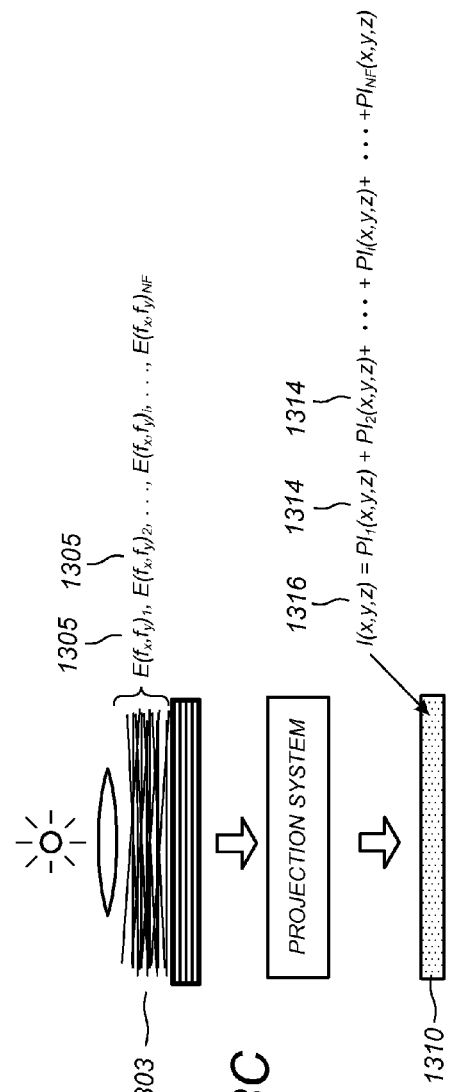
FIG. 13A
FIG. 13B
FIG. 13C

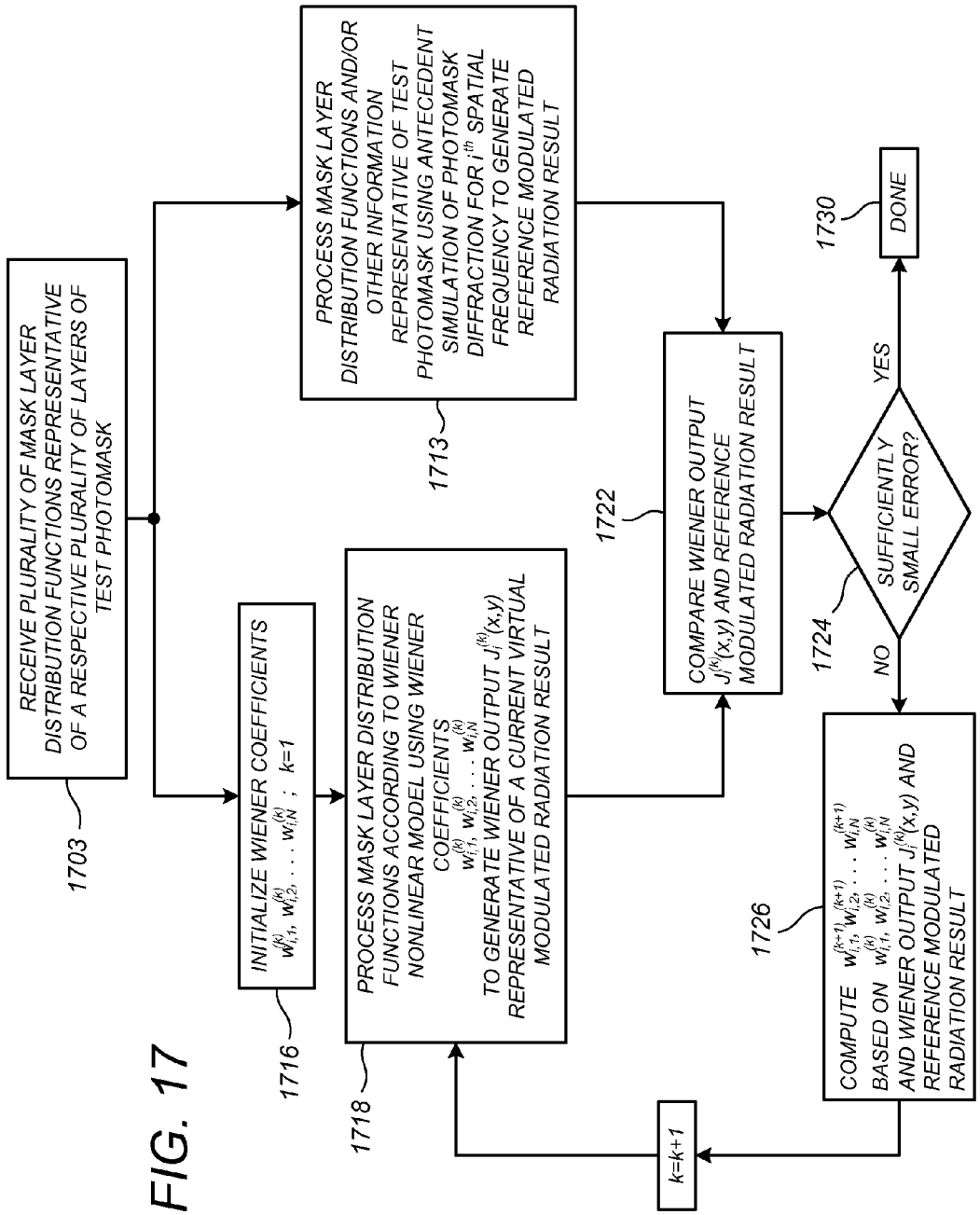

COMPUTER SIMULATION OF PHOTOLITHOGRAPHIC PROCESSING

CROSS-REFERENCE TO RELATED APPLICATIONS

This patent application claims the benefit of U.S. Provisional Ser. No. 60/948,467 filed Jul. 8, 2007, which is incorporated by reference herein. This patent application is a continuation-in-part of U.S. Ser. No. 11/708,444 filed Feb. 20, 2007, now abandoned, which is a continuation-in-part of U.S. Ser. No. 11/331,223, filed Jan. 11, 2006, now abandoned, each of which is incorporated by reference herein.

FIELD

This patent specification relates to computer simulation of photolithographic processes as may be employed, for example, in sub-wavelength integrated circuit fabrication environments.

BACKGROUND AND SUMMARY

Computer simulation has become an indispensable tool in a wide variety of technical endeavors ranging from the design of aircraft, automobiles, and communications networks to the analysis of biological systems, socioeconomic trends, and plate tectonics. In the field of integrated circuit fabrication, computer simulation has become increasingly important as circuit line widths continue to shrink well below the wavelength of light. In particular, the optical projection of circuit patterns onto semiconductor wafers, during a process known as photolithography, becomes increasingly complicated to predict as pattern sizes shrink well below the wavelength of the light that is used to project the pattern. Historically, when circuit line widths were larger than the light wavelength, a desired circuit pattern was directly written to an optical mask, the mask was illuminated and projected toward the wafer, the circuit pattern was faithfully recorded in a layer of photoresist on the wafer, and, after chemical processing, the circuit pattern was faithfully realized in physical form on the wafer. However, for sub-wavelength circuit line widths, it becomes necessary to "correct" or pre-compensate the mask pattern in order for the desired circuit pattern to be properly recorded into the photoresist layer and/or for the proper physical form of the circuit pattern to appear on the wafer after chemical processing. Unfortunately, the required "corrections" or pre-compensations are themselves difficult to refine and, although there are some basic pre-compensation rules that a human designer can start with, the pre-compensation process is usually iterative (i.e., trial and error) and pattern-specific to the particular desired circuit pattern.

Because human refinement and physical trial-and-error quickly become prohibitively expensive, optical proximity correction (OPC) software tools have been developed for the automation (optionally with a certain amount of human analysis and interaction along the way) of pre-compensating a desired circuit pattern before it is physically written onto a mask. Starting with a desired circuit pattern, an initial mask design is generated using a set of pre-compensation rules. For the initial mask design, together with a set of process conditions for an actual photolithographic processing system (e.g., a set of illumination/projection conditions/assumptions for a "stepper," a set of conditions/assumptions for the subsequent resist processing track, a set of conditions/assumptions for the subsequent etching process), a simulation is performed that generates simulated images of (i) the developed resist structure on the wafer that would appear after the resist processing track, and/or (ii) the etched wafer structure after the etching process. The simulated images are compared to the desired circuit pattern, and deviations from the desired circuit pattern are determined. The mask design is then modified based on the deviations, and the simulation is repeated for the modified mask design. Deviations from the desired circuit pattern are again determined, and so on, the mask design being iteratively modified until the simulated images agree with the desired circuit pattern to within an acceptable tolerance. The accuracy of the simulated images are, of course, crucial in obtaining OPC-generated mask designs that lead to acceptable results in the actual production stepper machines, resist processing tracks, and etching systems of the actual integrated circuit fabrication environments.

FIG. 1 illustrates a conceptual block diagram of a photolithographic processing system, which also serves as a general template for the way photolithographic process simulation systems are conceptually organized. It is to be appreciated, however, that the example of FIG. 1 is not presented by way of limitation, and that the various preferred simulation routines described hereinbelow can be aggregated or segregated in any of a variety of different ways without departing from the scope of the preferred embodiments. In the general process flow, a mask 104 (the terms "mask" and "photomask" are used interchangeably hereinbelow) based on a design intent 102 (arbitrarily chosen as an L-shaped feature for purposes of the present disclosure) is used by an optical exposure system 106 (e.g., a "stepper") to expose a resist film 114 that disposed atop a wafer 116. The optical exposure system 106 comprises an illumination system 108 and a projection system 110. The illumination system 108 causes incident optical radiation to impinge upon the mask 104. The incident optical radiation is modulated by the mask 104 and projected onto the resist film 114. The optical exposure system 108 causes an optical intensity pattern 118 to be present in the resist film 114 during the exposure interval. A The exposed resist film 114 atop the wafer 116 is then processed by a resist processing system 120, such as by baking at a high temperature for a predetermined period of time and subjecting to one or more chemical solutions, to result in a developed resist structure 124. An etching process, such as a wet etching process or plasma etching process, is then applied by an etch system 126 to result in an etched wafer structure 130.

FIGS. 2A-2C illustrate conceptual diagrams of the optical intensity pattern 118, developed resist structure 124, and etched wafer structure 130 of FIG. 1, respectively, as broken out into discrete levels for facilitating clear presentation of the preferred embodiments. With reference to FIG. 2A, the optical intensity pattern 118 can be characterized as comprising "D" levels $I(x,y,z_i)$, $l=1 \ldots D$, each level $I(x,y,z_l)$ being referenced as an optical intensity distribution 202. With reference to FIG. 2B, the developed resist structure 124 can be characterized as comprising "L" levels $R(x,y,z_n)$, $n=1 \ldots L$, each level $R(x,y,z_n)$ being referenced as a developed resist distribution 206. With reference to FIG. 2C, the etched wafer structure 130 can be characterized as comprising "J" distinct levels $W(x,y,z_j)$, $j=1 \ldots J$, each level $W(x,y,z_j)$ being referenced as an etched wafer distribution 210.

Notably, a typical thickness of the resist film 114 can be in the range of 100 30 nm-1000 nm and a desired height of the L-shaped feature on the etched wafer structure 130 can be hundreds of nanometers, while the desired line width of the L-shaped feature may be well under 100 nm (for example, 45 nm, 32 nm, and even 22 nm or below). In view of these very high aspect ratios, it becomes important for a simulation system to properly accommodate for the truly three-dimensional nature of the optical and chemical interactions that are taking place during the photolithographic process in order to be accurate. At same time, in view of the above-described iterative nature of the mask optimization process, it is desirable for the simulation results to be provided in a practicably short period of time, with increased ease of mask optimization being associated with faster computation times. Especially in view of the staggering amount of data associated with today's ever-shrinking and increasingly complex circuit patterns, there is a tension between providing sufficiently accurate simulations and providing sufficiently fast simulations.

While certain prior art approaches such as those based on differential-equation-solving techniques, finite difference techniques, or finite element techniques can provide accurate results, even to the extent of representing a kind of gold standard in their accuracy, they are generally quite slow. Approaches based on closed-form techniques avoid such timewise-recursive computation approaches and can therefore be much faster. However, many prior art closed-form techniques are believed to suffer from one or more shortcomings that are addressed by one or more of the preferred embodiments described hereinbelow. For example, many prior art closed-form techniques either ignore the third dimension altogether or are based on mathematical models do not adequately accommodate for the real-world, high aspect ratio, three-dimensional character of the interactions taking place. Other issues arise as would be apparent to one skilled in the art upon reading the present disclosure. By way of example, many known optical exposure system simulators operate on a simplifying assumption that the mask is a purely two-dimensional planar structure, whereas actual masks have some degree of thickness that affects the way the incident optical radiation is modulated. By way of further example, many of the above prior art techniques are unable to efficiently accommodate process variations in the photolithographic systems being modeled, and thus for each combination of values for physical variations in the photolithographic process (such as bake temperature, resist development time, etchant pH, stepper defocus parameter, etc.), such techniques require the entire (or almost entire) simulation process to be repeated essentially from the beginning. Provided in accordance with one or more of the preferred embodiments are methods, systems, and related computer program products for simulating a photolithographic processing system and/or for simulating a type or portion thereof such as an optical exposure system, a resist processing system, or etch processing system, in a manner that resolves one or more such shortcomings of the prior art. Although detailed herein primarily in terms of methods performed on described data, the scope of the preferred embodiments includes computer code stored on a computer-readable medium or in carrier wave format that performs the methods when operated by a computer, computer systems loaded and configured to operate according to the computer code, and generally any combination of hardware, firmware, and software mutually configured to operate according to the described methods.

According to one preferred embodiment, provided is a method for simulating a resist processing system according to a Wiener nonlinear model thereof, comprising receiving a plurality of precomputed optical intensity distributions corresponding to a respective plurality of distinct elevations in an optically exposed resist film, convolving each of the optical intensity distributions with each of a plurality of predetermined Wiener kernels to generate a plurality of convolution results, and cross-multiplying at least two of the convolution results to produce at least one cross-product. A first weighted summation of the plurality of convolution results and the at least one cross-product is computed using a respective first plurality of predetermined Wiener coefficients to generate a first Wiener output, and a resist processing system simulation result is generated based at least in part on the first Wiener output.

According to another preferred embodiment, provided is a method for calibrating a plurality of Wiener coefficients for use in a Wiener nonlinear model-based computer simulation of a resist processing system. First information representative of a reference developed resist structure associated with a test mask design is received. Second information is received representative of a plurality of precomputed optical intensity distributions corresponding to respective distinct elevations of an optical exposure pattern associated with the test mask design. Each of the optical intensity distributions is convolved with each of a plurality of predetermined Wiener kernels to generate a plurality of convolution results, and at least two of the convolution results are cross-multiplied to produce at least one cross-product. The plurality of Wiener coefficients are initialized. A current Wiener output is generated by computing a weighted summation of the plurality of convolution results and the at least one cross-product using the plurality of Wiener coefficients. The current Wiener coefficients are processed to generate third information representative of a current virtual developed resist structure, and the plurality of Wiener coefficients is modified based on the first information and the third information. The current Wiener output is then recomputed using the modified Wiener coefficients, and the process is repeated until a sufficiently small error condition is reached between the third information and the first information, at which point the latest version of the modified Wiener coefficients constitute the calibrated Wiener coefficients.

According to another preferred embodiment, provided is a method for simulating an etch system according to a Wiener nonlinear model thereof, comprising receiving a plurality of precomputed developed resist distributions corresponding to a respective plurality of distinct elevations in a developed resist structure, convolving each of the developed resist distributions with each of a plurality of predetermined Wiener kernels to generate a plurality of convolution results, and cross-multiplying at least two of the convolution results to produce at least one cross-product. A first weighted summation of the plurality of convolution results and the at least one cross-product is computed using a respective first plurality of predetermined Wiener coefficients to generate a first Wiener output, and an etch processing system simulation result is generated based at least in part on the first Wiener output.

According to another preferred embodiment, provided is a method for calibrating a plurality of Wiener coefficients for use in a Wiener nonlinear model-based computer simulation of an etch system. First information is received representative of a reference etched wafer structure associated with a precomputed test developed resist structure. Second information is received representative of a plurality of developed resist distributions corresponding to a respective plurality of distinct elevations in the precomputed test developed resist structure. Each of the developed resist distributions is convolved with each of a plurality of predetermined Wiener kernels to generate a plurality of convolution results, and at least two of the convolution results are cross-multiplied to produce at least one cross-product. The plurality of Wiener coefficients are initialized. A current Wiener output is generated by computing a weighted summation of the plurality of convolution results and the at least one cross-product using the plurality of Wiener coefficients, and the current Wiener output is processed to generate third information representative of a current virtual etched wafer structure. The current Wiener output is then recomputed using the modified Wiener coefficients, and the process is repeated until a sufficiently small error condition is reached between the third information and the first information, at which point the latest version of the modified Wiener coefficients constitute the calibrated Wiener coefficients.

According to another preferred embodiment, provided is a method for simulating an optical exposure system in which optical radiation incident upon a photomask is modulated thereby and projected toward a target to generate a target intensity pattern, the optical radiation incident upon the photomask comprising a plurality of spatial frequency components. First information representative of a first of the plurality of spatial frequency components is received. Each of the mask layer distribution functions is convolved with each of a plurality of predetermined Wiener kernels to generate a plurality of convolution results, and at least two of the convolution results are cross-multiplied to produce at least one cross-product. A first Wiener output representative of a first modulated radiation result associated with the first spatial frequency component is computed as a weighted summation of the plurality of convolution results and the at least one cross-product using a respective first plurality of predetermined Wiener coefficients, and a target intensity pattern is generated based at least in part on the first modulated radiation result.

According to another preferred embodiment, provided is a method for calibrating a plurality of Wiener coefficients for use in a Wiener nonlinear model-based computer simulation of photomask diffraction of incident optical radiation at a selected spatial frequency. First information representative of a reference modulated radiation result associated with a test photomask and the selected spatial frequency is received. A plurality of mask layer distribution functions representative of a respective plurality of layers of the test photomask is received. Each of the mask layer distribution functions is convolved with each of a plurality of predetermined Wiener kernels to generate a plurality of convolution results, and at least two of the convolution results are cross-multiplied to produce at least one cross-product. The plurality of Wiener coefficients is initialized. A current Wiener output representative of a current virtual modulated radiation result is generated as a weighted summation of the plurality of convolution results and the at least one cross-product using the plurality of Wiener coefficients. The plurality of Wiener coefficients is modified based on the reference modulated radiation result and the current virtual modulated radiation result. The current Wiener output is then recomputed using the modified Wiener coefficients, and the process is repeated until a sufficiently small error condition is reached between the current modulated radiation result and the reference modulated radiation result, at which point the latest version of the modified Wiener coefficients constitute the calibrated Wiener coefficients.

According to another preferred embodiment, provided is a method for simulating a resist processing system that undergoes process variations characterized by a plurality of process variation factors according to a Wiener nonlinear model thereof. A plurality of precomputed optical intensity distributions is received corresponding to a respective plurality of distinct elevations in an optically exposed resist film. Each of the optical intensity distributions is convolved with each of a plurality of predetermined Wiener kernels to generate a plurality of convolution results, and at least two of the convolution results are cross-multiplied to produce at least one cross-product. Values for the plurality of process variation factors are received. Each of a plurality of Wiener coefficients is computed as a respective predetermined polynomial function of the process variation factors characterized by a respective distinct set of predetermined polynomial coefficients. A Wiener output is generated as a weighted summation of the plurality of convolution results and the at least one cross-product using the computed plurality of Wiener coefficients, and a resist processing system simulation is generated based at least in part on the Wiener output.

According to another preferred embodiment, provided is a method for calibrating a plurality of sets of polynomial coefficients for use in a Wiener nonlinear model-based computer simulation of a resist processing system, the resist processing system undergoing process variations characterized by a plurality of process variation factors. First information is received representative of a plurality of reference developed resist structures, the reference developed resist structures being associated with a common test mask design but each being associated with a respective one of a known plurality of distinctly valued process variation factor sets associated with the resist processing system. Second information is received representative of a plurality of precomputed optical intensity distributions corresponding to respective distinct elevations of an optical exposure pattern associated with the common test mask design. Each of the optical intensity distributions is convolved with each of a plurality of predetermined Wiener kernels to generate a plurality of convolution results, and at least two of the convolution results are cross-multiplied to produce at least one cross-product. The plurality of sets of polynomial coefficients is initialized. A plurality of current Wiener outputs associated with respective ones of the distinctly valued process variation factor sets is computed, wherein, for each distinctly valued process variation factor set, computing the current Wiener output comprises (i) computing each of a plurality of Wiener coefficients as a respective predetermined polynomial function of the process variation factors, each predetermined polynomial function using a respective one of the sets of polynomial coefficients, and (ii) generating the current Wiener output as a weighted summation of the plurality of convolution results and the at least one cross-product using the computed plurality of Wiener coefficients. The plurality of current Wiener outputs is processed to generate third information representative of a respective plurality of current virtual developed resist structures, and each of the plurality of sets of polynomial coefficients is modified based on the first information and the third information. The plurality of current Wiener outputs is then recomputed using the plurality of modified sets of polynomial coefficients, and the process is repeated until a sufficiently small error condition is reached between the third information and the first information, at which point the latest version of the plurality of modified sets of polynomial coefficients constitutes the calibrated plurality of sets of polynomial coefficients.

BRIEF DESCRIPTION OF THE DRAWINGS

FIG. 13A illustrates a conceptual side view of an optical exposure system and a mask therein being illuminated by incident radiation at a first single spatial frequency;

FIG. 13B illustrates the optical exposure system and mask of FIG. 13A with the mask being illuminated by incident radiation at an $i^{th}$ single spatial frequency;

FIG. 13C illustrates the optical exposure system and mask of FIG. 13A with the mask being illuminated by incident radiation at multiple spatial frequencies;

FIG. 17 illustrates calibrating a simulation model for modulation of incident radiation by a mask according to a preferred embodiment;

DETAILED DESCRIPTION

Figure 1:
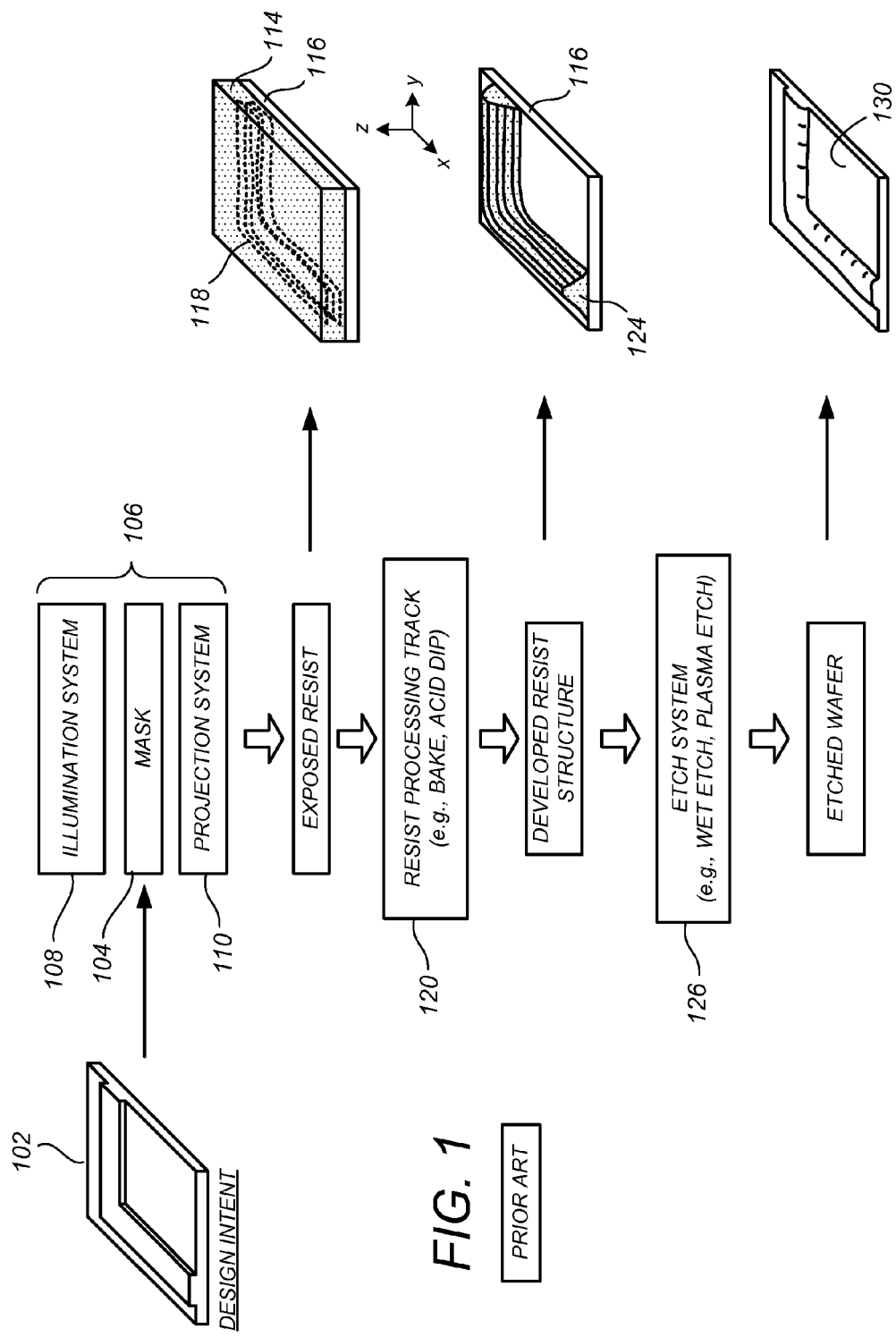
FIG. 1 illustrates a conceptual block diagram of a photolithographic processing system.
Figure 2A:
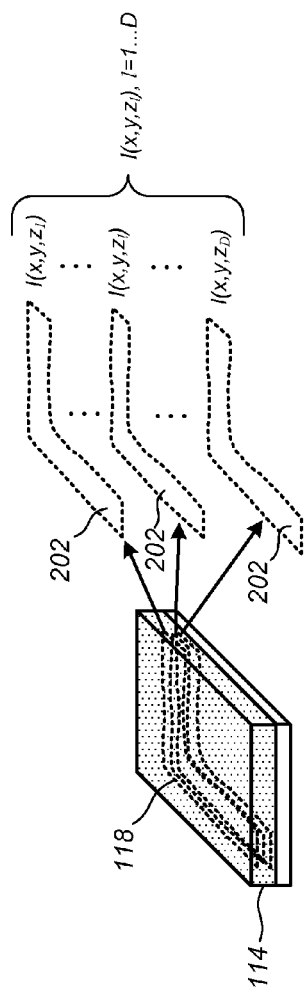
FIG. 2A illustrates a conceptual diagram of an optical intensity pattern as broken out into discrete levels.
Figure 2B:
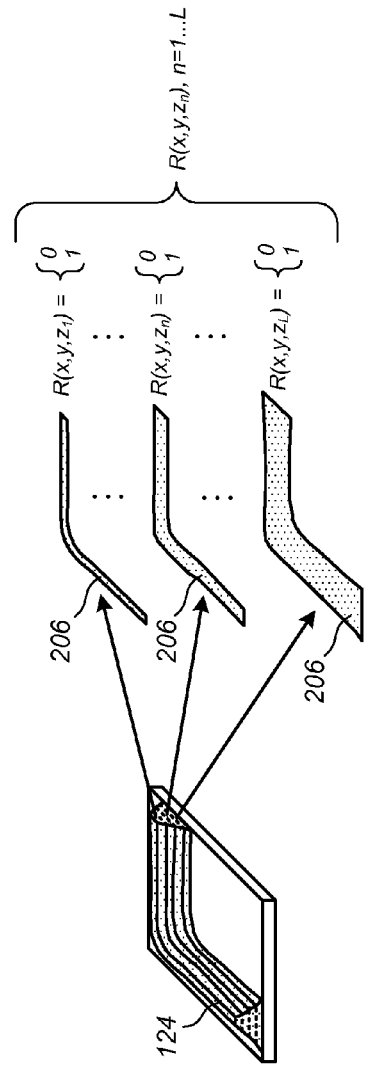
FIG. 2B illustrates a conceptual diagram of a resist structure as broken out into discrete levels.
Figure 2C:
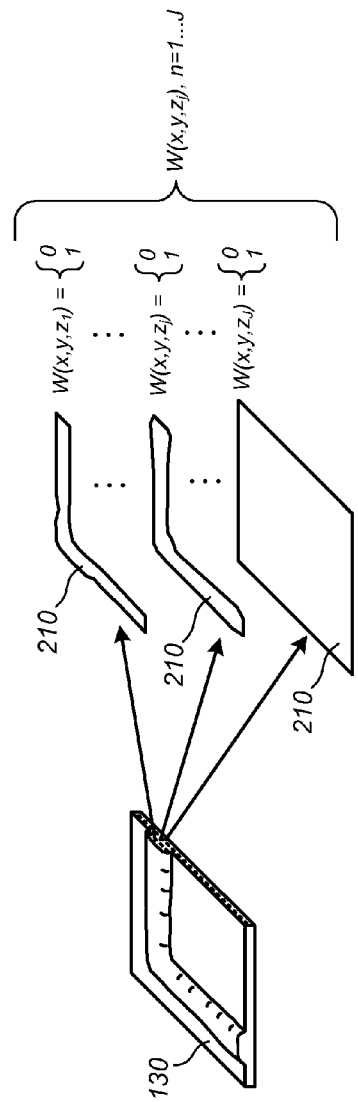
FIG. 2C illustrates a conceptual diagram of an etched wafer structure as broken out into discrete levels.
Figure 3:
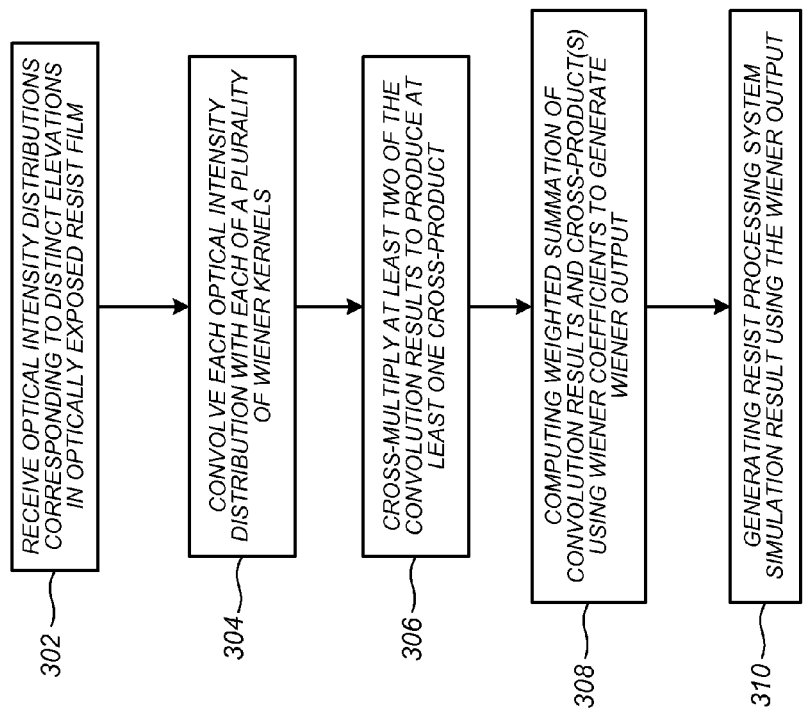
FIG. 3 illustrates simulating a resist processing system according to a preferred embodiment.
Figure 4:
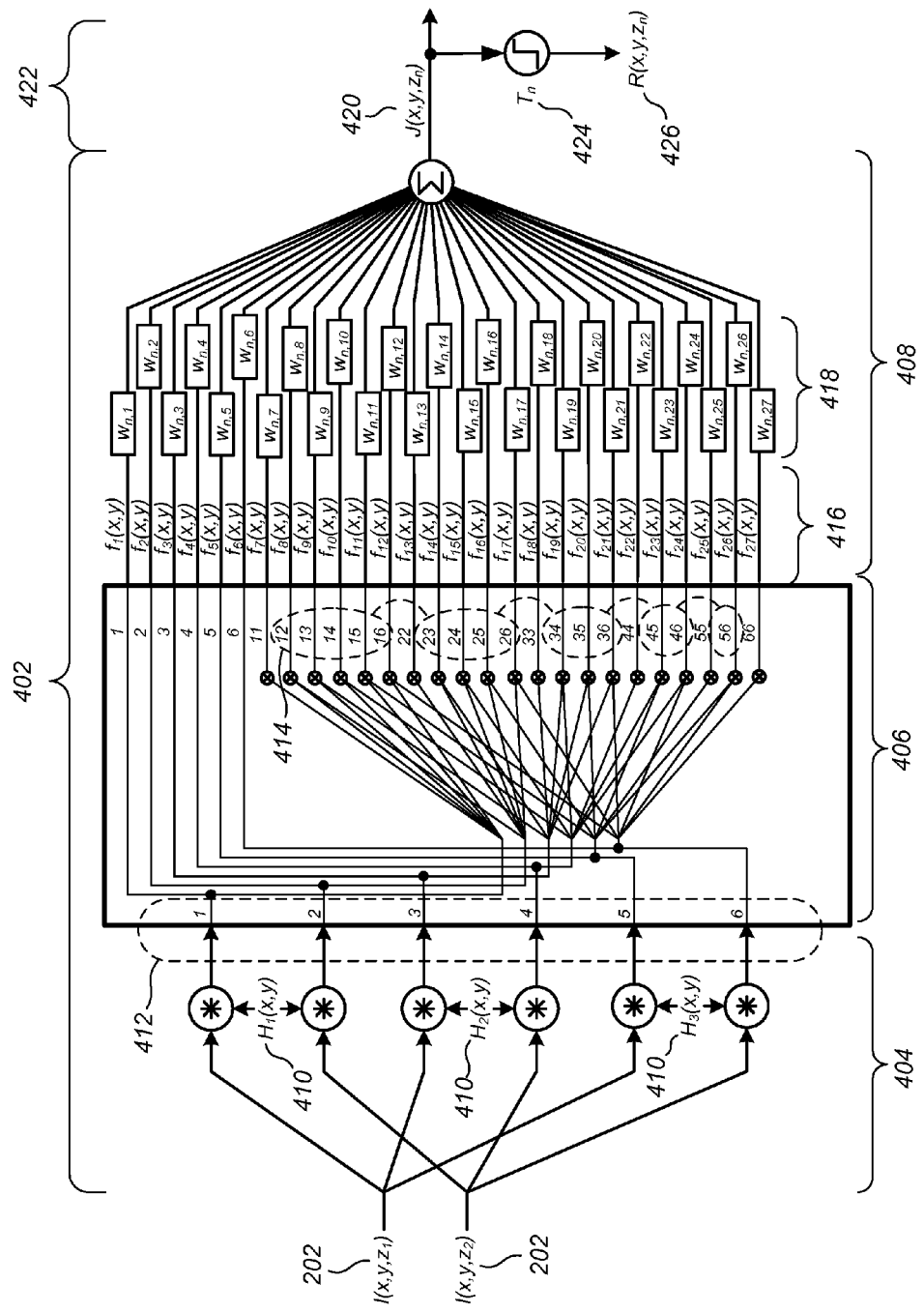
FIG. 4 illustrates a resist processing system simulation model according to a preferred embodiment.

FIG. 3 illustrates simulating a resist processing system according to a preferred embodiment, which is described herein in conjunction with FIG. 4 that illustrates a resist processing system simulation model according to a preferred embodiment. Referring first to FIG. 4, the resist processing system simulation model comprises a first portion 402 which comprises operations falling into the Wiener class and which is referenced hereinafter as Wiener operator 402. The model further comprises a second portion 422 which comprises at least one operation (here, a thresholding operation) that does not fall into the Wiener class and which is referenced hereinafter as non-Wiener operator 422. A discussion of operations inside and outside the Wiener class can be found in Schetzen, M., "Nonlinear System Modeling Based on the Wiener Theory," Proceedings of the IEEE, Vol. 69, No. 12 (1981), which is incorporated by reference herein.

Wiener operator 402 comprises a convolution operator 404, a pointwise cross-multiplication operator (PCMO) 406, and a linear combination operator (LCO) 408. Convolution operator 404 receives each a convolution of each optical intensity distribution 202 with each of a plurality of Wiener kernels 410 to produce a plurality of convolution results 412. Although the overall optical intensity pattern is modeled as having D=2 depth levels in the example of FIG. 4, in other preferred embodiments there may be more depth levels used such as D=3 to 5 depth levels, although the scope of the preferred embodiments is not so limited. By way of example and not by way of limitation, the model of FIG. 4 may be run for a typical sampling distance of 2-3 nm, i.e., neighboring data points in the optical intensity distributions 202 and Wiener kernels 410, as well as other spatially related data arrays in the simulation system, represent points in actual space that are separated by 2-3 nm. Also by way of example and not by way of limitation, each Wiener kernel 410 may be between about 5×5 data points and 100×100 data points in size which could reflect, for an exemplary sampling distance of 2 nm, a physical resist processing system having a mutual influence distance (resist processing ambit) of between about 10 nm and 200 nm.

In accordance with known digital processing principles, and unless stated specifically otherwise herein, references to convolution operations also refer to frequency domain operations (e.g., transformation into the frequency domain, multiplication, and inverse transformation from the frequency domain) that can be used to generate the convolution results. In practice, since many practical photolithographic processes (including many OPC processes and production qualification processes) often focus on a population of small, discrete neighborhoods of a wafer, each neighborhood being well under a micron in size, it has been found practical to compute the convolution result 412 for any particular neighborhood by tiling the Wiener kernel 410 out to a dimension that represents about one square micron in size and that is a power of two, and then using an FFT based approach to compute the convolution result for a one square micron region centered on that neighborhood.

According to a preferred embodiment, the Wiener kernels 410 are predetermined and fixed during both calibration and use of the resist processing simulation system of FIG. 4. Any of a wide variety of orthonormal basis sets can be used for the Wiener kernels 410. In one preferred embodiment, the Wiener kernels 410 comprise an orthonormal set of Hermite-Gaussian basis functions. In another preferred embodiment, the Wiener kernels 410 comprise an orthonormal set of Laguerre-Gaussian basis functions. The number of Wiener kernels 410 used in the convolution operator 404 is also predetermined and fixed during both calibration and use of the resist processing simulation system of FIG. 4. Although shown with three Wiener kernels 410 in FIG. 4, it has been found more preferable to use between 5 and 10 Wiener kernels 410, although the scope of the preferred embodiments is not so limited.

As used herein, pointwise cross-multiplication operator refers to an operator whose functionality includes achieving at least one cross-multiplication among two of a plurality of arrays input thereto to generate at least one cross-product, the term cross-product being used herein in the more general sense that it results from multiplying two arrays, the term cross-product not being used in the vector calculus sense unless indicated otherwise. For the particular example of FIG. 4, the PCMO 406 achieves pointwise multiplications between each convolution result 412 and every other convolution result 412 to yield cross-products 414. In other preferred embodiments (not shown), the PCMO 406 can yield as few as a single cross-product 414. The PCMO 406 is also illustrated in FIG. 4 as also providing straight pass-through of the convolution results 412 as well as squared versions of the convolution results 412. Accordingly, the PCMO 406 provides PCMO outputs 416 comprising the convolution results 412, the cross products 414, and the squares of the convolution results 412. Although PCMO 406 is shown as providing up to second order cross-products in FIG. 4, PCMOs yielding third and higher orders of cross-products are within the scope of the preferred embodiments.

The LCO 408 of the Wiener operator 402 receives the PCMO outputs 416 and achieves a weighted summation thereof according to a respective plurality of Wiener coefficients 418, as indicated in FIG. 4. According to a preferred embodiment, the Wiener coefficients 418 are predetermined and fixed during use of the use of the resist processing simulation system of FIG. 4, i.e., when processing the optical intensity distributions to generate simulation results, but are varied during calibration of the resist processing simulation system in a process that optimizes their values based on reference criteria associated with the resist processing system to be simulated.

The LCO 408 generates a Wiener output 420 that is then further processed by the non-Wiener operator 422 to generate a resist processing system simulation result 426. For the preferred embodiment of FIG. 4, the non-Wiener operator 422 thresholds the Wiener output 420 at a predetermined threshold value $T_n$, and the resist processing system simulation result 426 comprises a binary contour plot $R(x,y,z_n)$ representing the developed resist structure at a single predetermined output level $z_n$. As indicated by the subscripts "n" in the LCO 408 of FIG. 4, those Wiener coefficients 418 are calibrated to yield results applicable only to the $n^{th}$ level in the developed resist structure from the PCO outputs 416. As described further infra with respect to FIG. 7, differently calibrated Wiener coefficients 418 are required for each different level in the developed resist structure although, advantageously, the same common set of PCO outputs 416 is "reused" for all of these different levels.

Referring now again to FIG. 3, a plurality of precomputed optical intensity distributions is received corresponding to a respective plurality of distinct elevations in an optically exposed resist film (step 302), and each of the optical intensity distributions is convolved with each of a plurality of predetermined Wiener kernels (step 304) to generate a plurality of convolution results. At least two of the convolution results are cross-multiplied (step 306) to produce at least one cross-product. A first weighted summation of the plurality of convolution results and the at least one cross-product is computed (step 308) using a respective first plurality of predetermined Wiener coefficients to generate a first Wiener output, and a resist processing system simulation result is generated (step 310) based at least in part on the first Wiener output.

Figure 5:
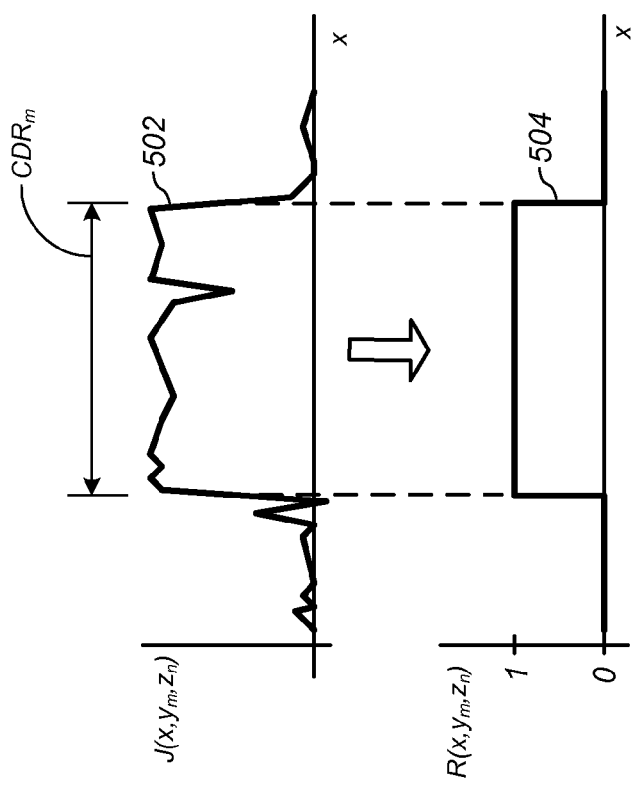
FIG. 5 illustrates a cross section of a Wiener output, a cross section of a resist contour plot, and an associated critical dimension associated with a resist processing system simulation according to a preferred embodiment.

FIG. 5 illustrates a cross section 502 of a Wiener output, a cross section 504 of a resist contour plot, and a critical dimension $CDR_m$ associated with a single-output (at layer $z_n$) resist processing system simulation according to a preferred embodiment. FIG. 5 illustrates the impact of the non-Wiener operator 422 of FIG. 4 that computes a binary "non-physical" function from the "physical" Wiener output. In certain practical photolithographic processes (including many OPC processes and production qualification processes) it is not really necessary to generate a viewable contour plot. Accordingly, for one preferred embodiment, the critical dimension $CDR_m$ can be extracted directly from the Wiener output (plot 502) and provided directly as a resist processing system simulation result. The critical dimension extraction process can be based on any of a variety of different methods ranging from simple thresholding to more complex analysis of local and regional behaviors of the Wiener output. Although this extraction process will usually fall into the non-Wiener class of operations, the scope of the preferred embodiments is not so limited.

Figure 6:
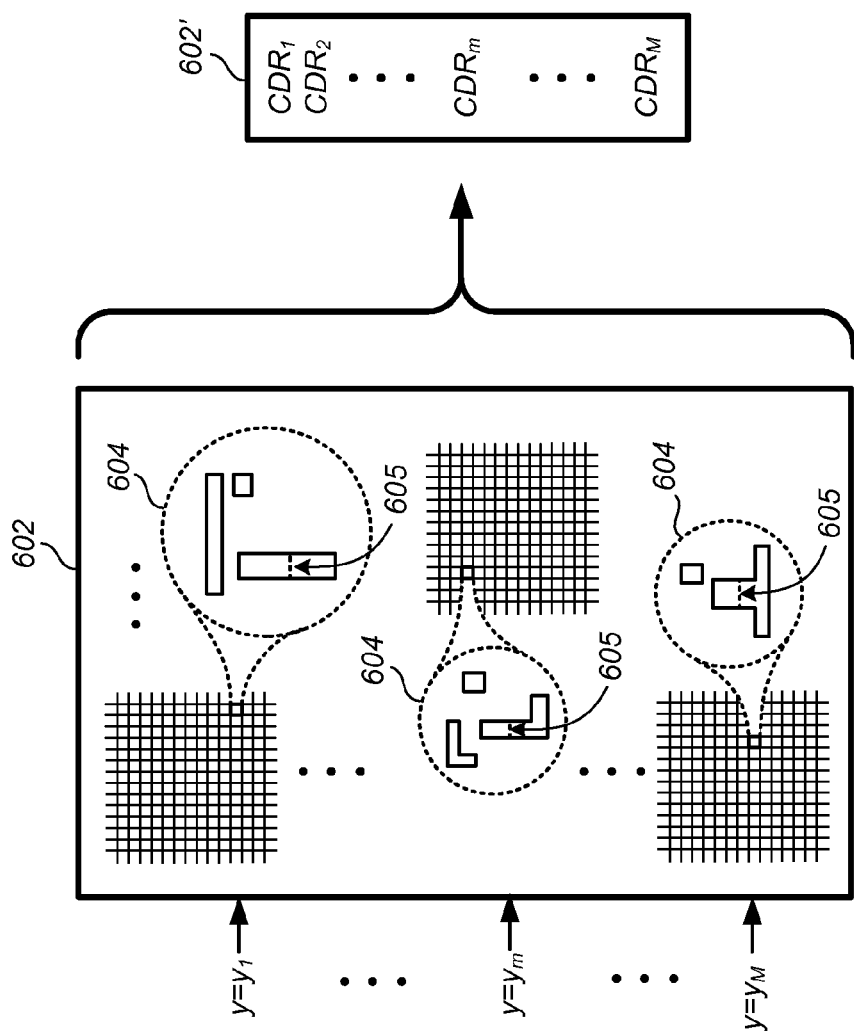
FIG. 6 illustrates a conceptual aerial view of a resist processing system simulation result according to a preferred embodiment.

FIG. 6 illustrates a conceptual aerial view of a portion of a wafer 602 that has undergone resist processing (simulated or real). As discussed previously, many practical photolithographic processes do not require the computation of visually observable images of the simulation results, and instead focus on numerical metrics taken from a preselected population of small neighborhoods of a wafer, which are represented as neighborhoods 604 in FIG. 6. According to a preferred embodiment, the resist processing simulation results generated according to the model of FIG. 4 are expressed as an array 602' of M critical dimensions, each for a predetermined region of interest (ROI) 605. During some of the model calibration processes described further hereinbelow that require physical measurements of reference $CDR_m$ values from the physical resist processing system to be simulated (or, alternatively, reference $CDR_m$ values from a slow but accurate finite element simulator), the number M is often on the order of a thousand or less. Advantageously, however, during forward usage of the calibrated simulation models according to one or more of the preferred embodiments, such as during mask design, process qualification, etc., the number M can be as large needed, even in the millions or beyond, in view of the advantageously high efficiency that accompanies their advantageously high accuracy.

Figure 7:
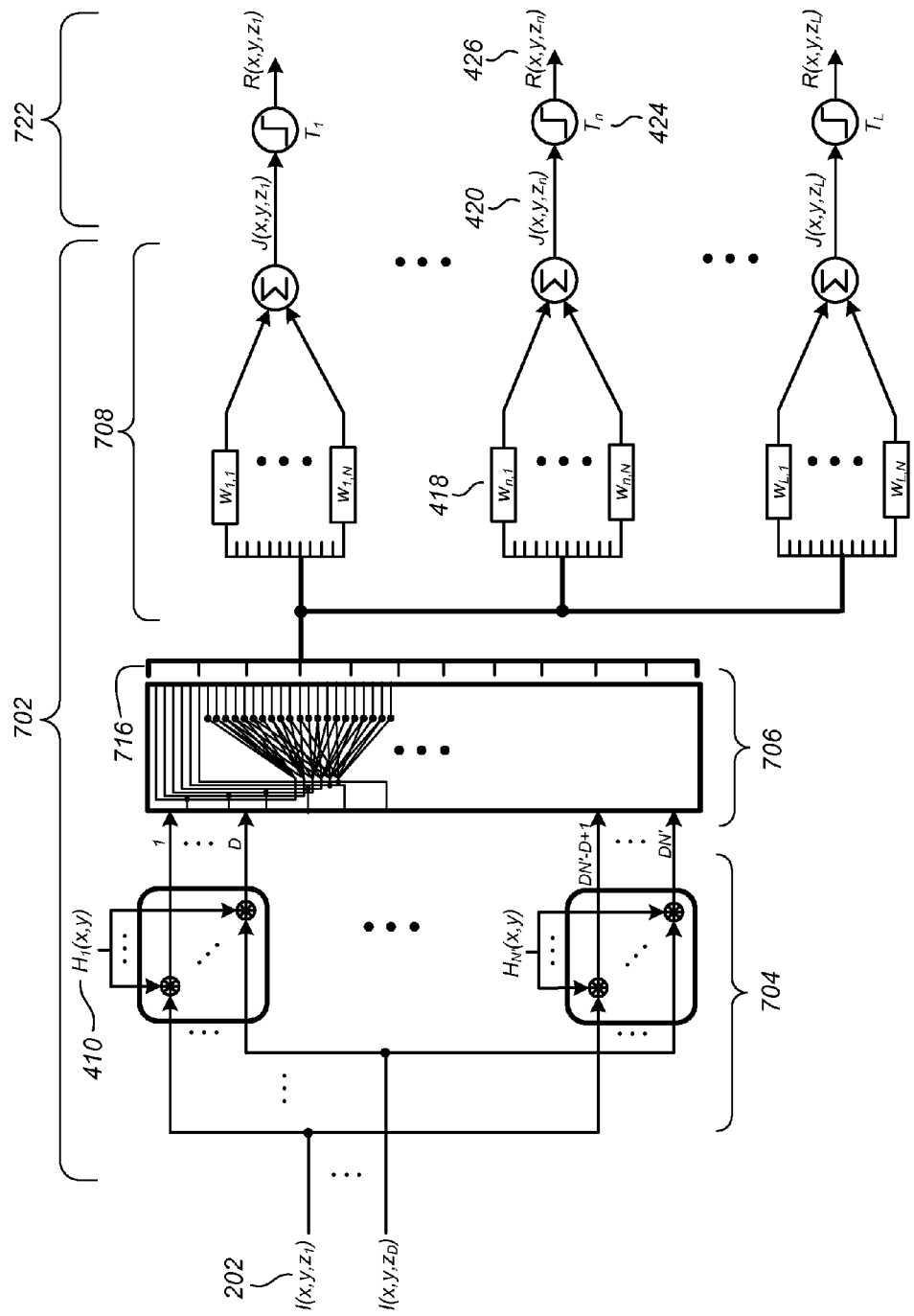
FIG. 7 illustrates a resist processing system simulation model for a plurality of output levels according to a preferred embodiment.

FIG. 7 illustrates a resist processing system simulation model for a plurality L of developed resist structure output levels according to a preferred embodiment. The model of FIG. 7 is built upon and highly similar to the model of FIG. 4, comprising a Wiener operator 702 and a non-Wiener operator 722, the Wiener operator 702 comprising a convolution operator 704 using similar Wiener kernels 410, a PCMO 706, and an LCO 708, except that L sets of Wiener coefficients 418 are provided, each set being for a distinct one of the L sets of levels and, preferably, each set being separately calibrated for its respective level. The non-Wiener operator 722 comprises a distinct threshold $T_n$ for each $n^{th}$ Wiener output. In addition to being generalized to L developed resist structure output levels, the preferred embodiment of FIG. 7 is generalized to D optical intensity distributions 202 and N' Wiener kernels 410, in which case the number of convolution results therebetween is equal to DN'.

Figure 8:
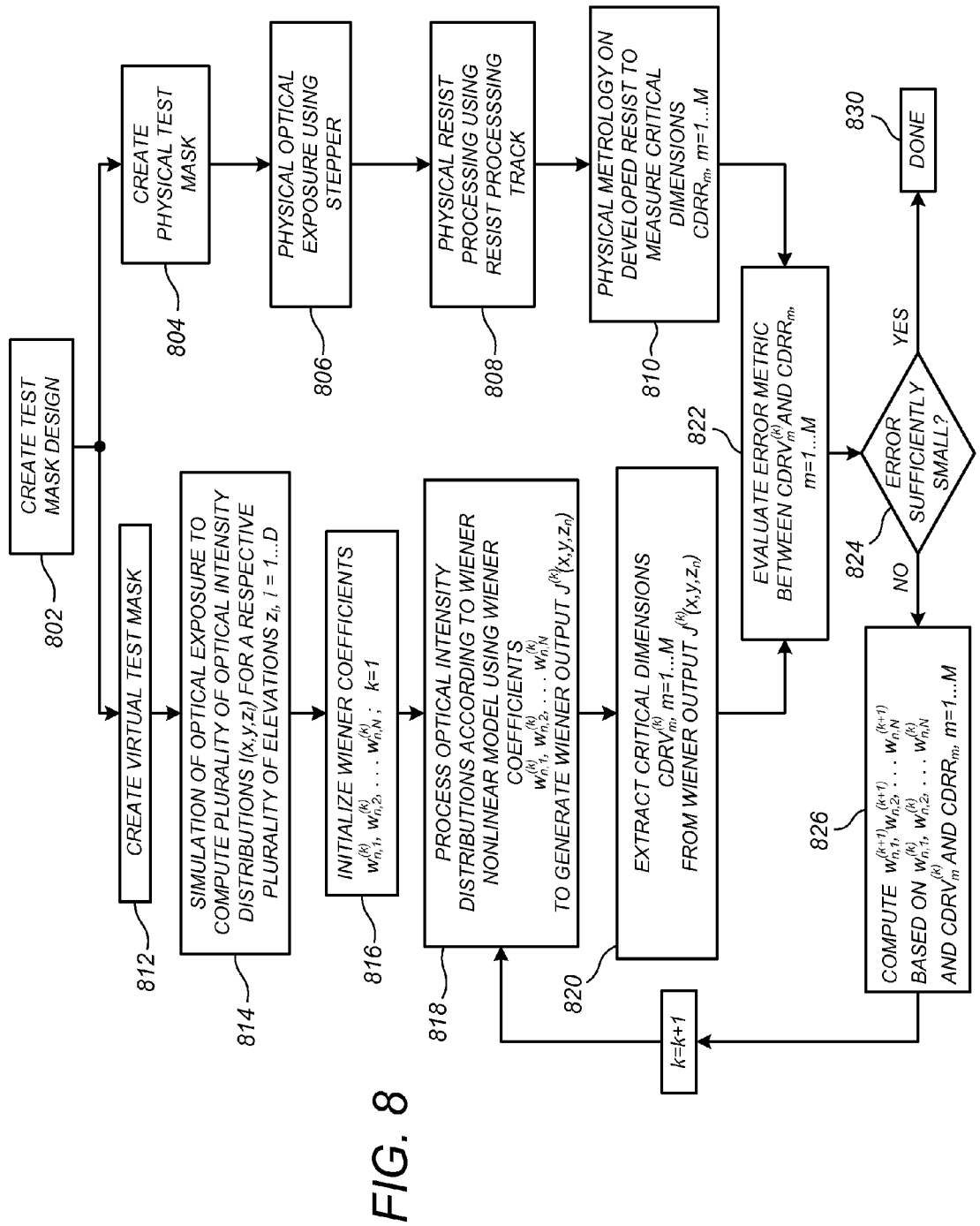
FIG. 8 illustrates calibrating a resist processing system simulation according to a preferred embodiment.

FIG. 8 illustrates calibrating a resist processing system simulation according to a preferred embodiment, the resist processing system simulation corresponding to the model of FIG. 4, the goal being to optimize the Wiener coefficients 418 based on known or knowable information regarding the physical resist processing system to be simulated. Based on a test mask design (step 802), a physical test mask is created (step 804) and exposed using an optical stepper (step 806). The physical wafer with the exposed resist is then subjected to an actual physical version of the resist processing system to be simulated (step 810), and physical metrology is performed in the physical developed resist structure to determine a set of reference critical dimensions CDRR therefrom. Meanwhile, a simulation of an optical exposure process using a virtual version of the test mask (steps 812 and 814) is performed using an optical exposure simulator that is preferably matched closely to the actual optical stepper of step 806 to result in D computed sets of optical intensity distributions.

The Wiener coefficients 418 are initialized (step 816). The D optical intensity distributions are processed according to the Wiener model 402 using the current version of the Wiener coefficients 418 to generate a current version of the Wiener output 420 (step 818) and a corresponding current set of critical dimensions CDRV are extracted from the current version of the Wiener output 420 (step 820). An error metric between the current critical dimensions CDRV and the reference critical dimensions CDRR is evaluated (step 822). If the error metric is sufficiently small at step 824, the process is complete (step 830) and the latest version of the Wiener coefficients 418 constitutes the calibrated Wiener coefficients 418. If the error metric is not sufficiently small, then at step 826 a next set of Wiener coefficients 418 is computed based on the arrays of CDRV and CDRR values (for example, using a Landweber-type iteration procedure). The step 818 is then executed for the next set of Wiener coefficients 418 and the process continues until the sufficiently small error condition is reached.

Figure 9:
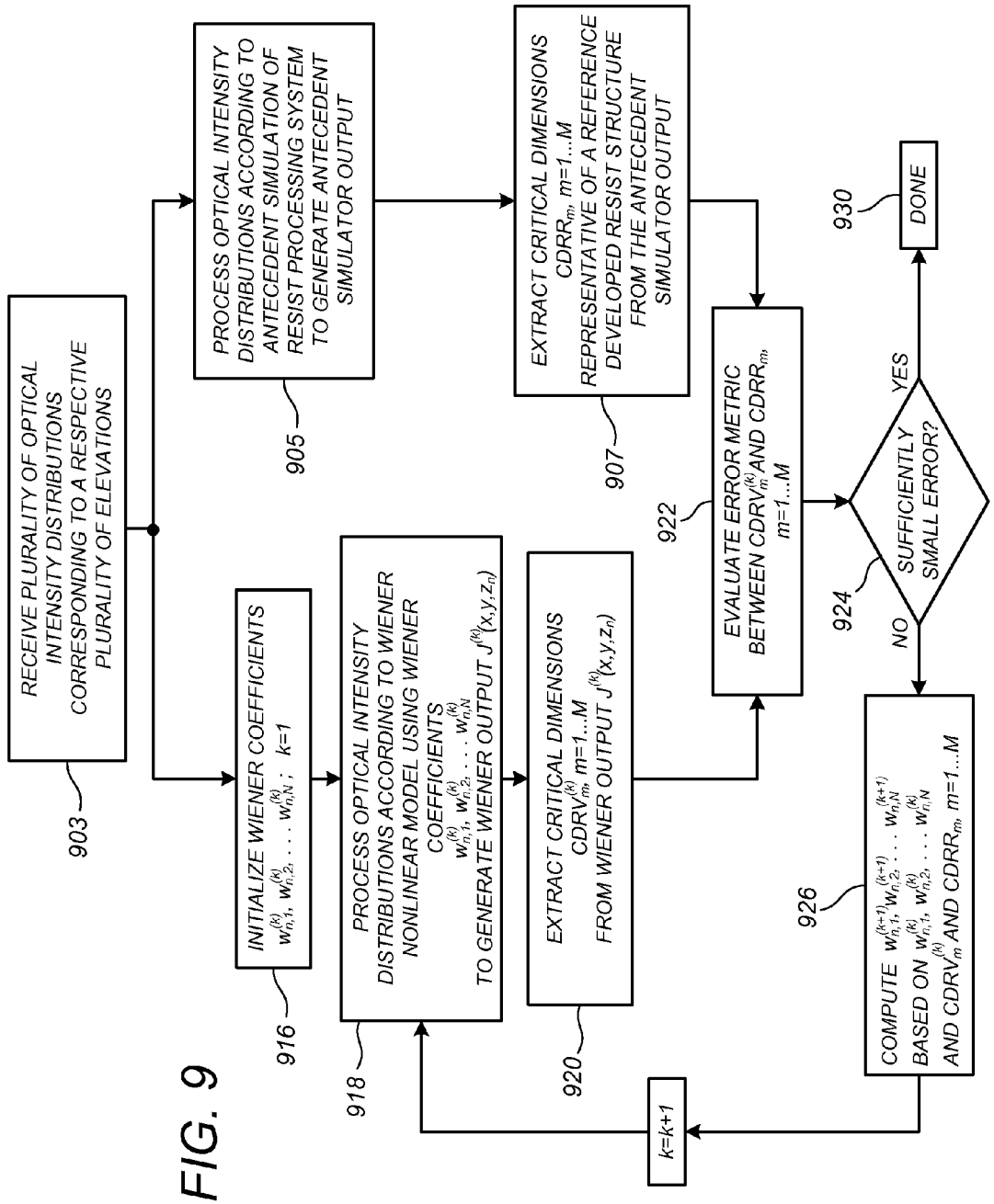
FIG. 9 illustrates calibrating a resist processing system simulation according to a preferred embodiment.

FIG. 9 illustrates an alternate method for calibrating a resist processing system simulation according to a preferred embodiment. At step 903, a plurality D of computed sets of optical intensity distributions is received. Steps 916, 918, 920, 922, 924, and 926 are carried out in the same respective manner as steps 816, 818, 820, 822, 824, and 826 of the method of FIG. 8, except the reference critical dimensions CDRR have been acquired differently. More particularly, at step 905 the plurality D of optical intensity distributions are processed according to an antecedent simulation of the resist processing system to generate an antecedent simulator output, and at step 907 the reference critical dimensions CDRR are extracted from the antecedent simulator output. Advantageously, a resist processing simulation system according to the model of FIG. 4 provides for an ability to readily "learn" about a particular resist processing system from another simulation of that system. By way of example and not by way of limitation, the antecedent simulator can comprise one or more of a differential-equation-solving simulator, a finite difference simulator, a finite element simulator, and a closed-form model simulator. According to one preferred embodiment, the antecedent simulation of the resist processing system is based on an analogous Wiener nonlinear model except having lower order cross-products of the convolution results.

Figure 10:
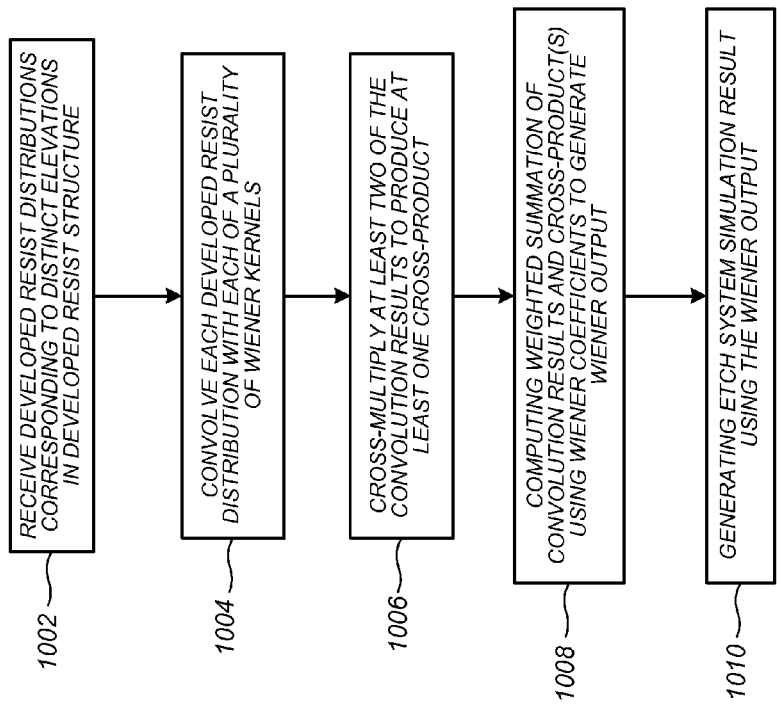
FIG. 10 illustrates simulating an etch system according to a preferred embodiment.

FIG. 10 illustrates simulating an etch system according to a preferred embodiment, comprising receiving a plurality of precomputed developed resist distributions corresponding to a respective plurality of distinct elevations in a developed resist structure (step 1002), convolving each of the developed resist distributions with each of a plurality of predetermined Wiener kernels to generate a plurality of convolution results (step 1004), and cross-multiplying at least two of the convolution results to produce at least one cross-product (step 1006). A first weighted summation of the plurality of convolution results and the at least one cross-product is computed (step 1008) using a respective first plurality of predetermined Wiener coefficients to generate a first Wiener output, and an etch processing system simulation result is generated (step 1010) based at least in part on the first Wiener output.

Figure 11:
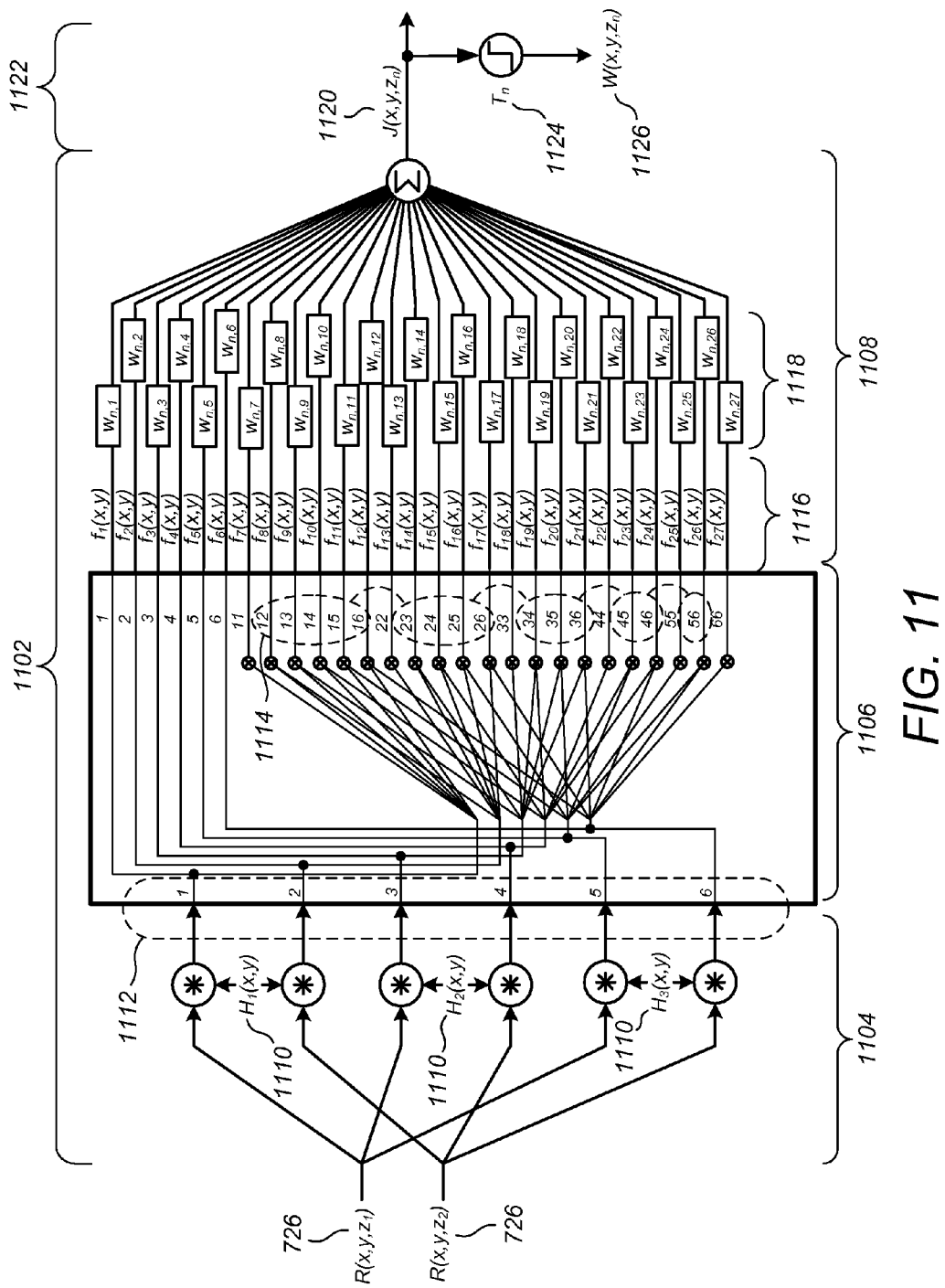
FIG. 11 illustrates an etch system simulation model for one output level according to a preferred embodiment.

FIG. 11 illustrates an etch system simulation model for one output level according to a preferred embodiment. The model comprises a serial combination of a Wiener operator 1102 that generates a Wiener output 1120 and a non-Wiener operator 1122 (a threshold operator with threshold 1124) that generates an etch system simulation result 1126. The Wiener operator 1102 comprises a convolution operator 1104 that convolves each input developed resist distribution with each of a plurality of Wiener kernels 1110 to generate a plurality of convolution results 1112, a PCMO 1106 that provides outputs 1116 comprising the convolution results 1112, cross products thereof 1114, and squares of the convolution results 1112 to an LCO 1108 that computes a weighted summation thereof according to a respective plurality of calibrated Wiener coefficients 1118. Although shown for a single elevation $z_n$ in the resultant etched wafer structure, the model is readily extended to a plurality J of elevations in the resultant etched wafer structure, in a manner similar to the way the single developed resist level model of FIG. 4 is extended to the multiple developed resist level model of FIG. 7.

Figure 12:
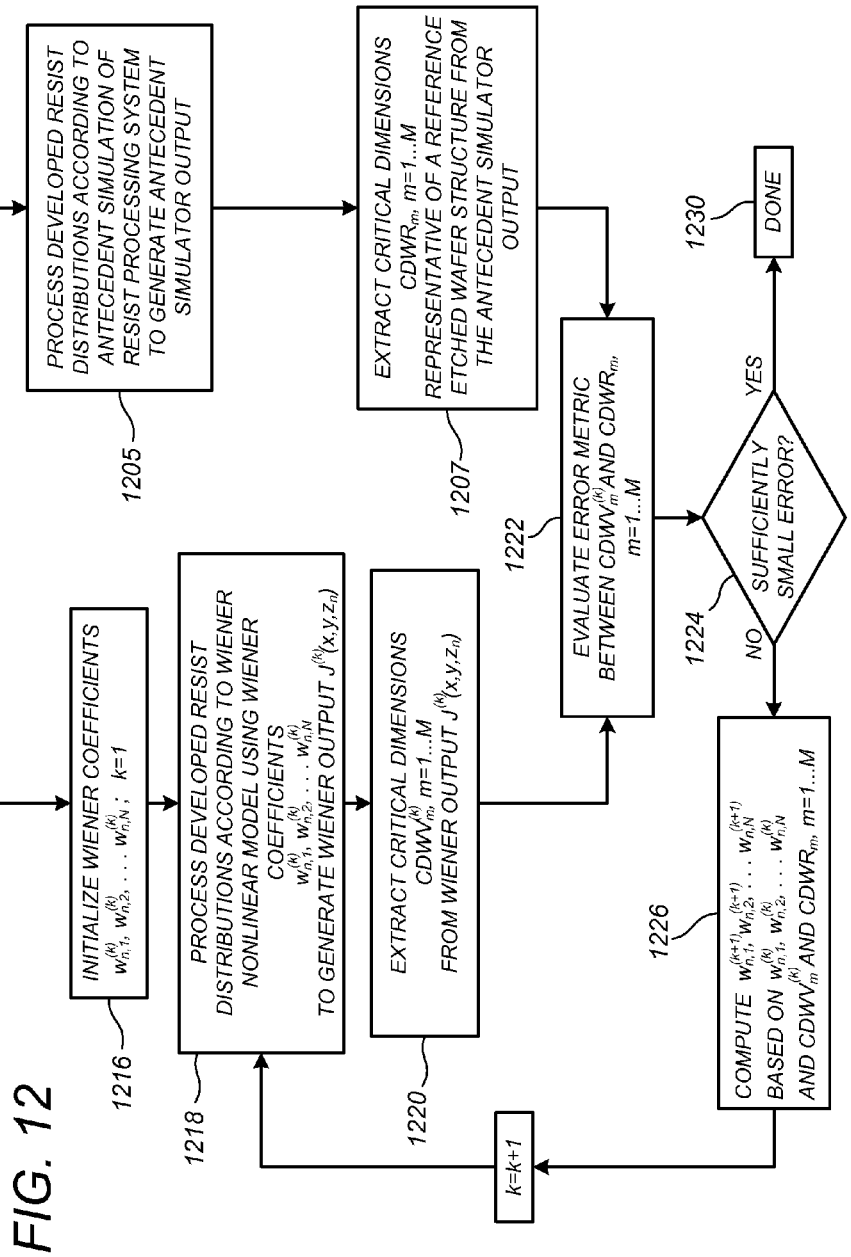
FIG. 12 illustrates calibrating an etch system simulation according to a preferred embodiment.

FIG. 12 illustrates calibrating an etch system simulation according to a preferred embodiment. The steps 1203-1230 for FIG. 12 are structured and executed in an overall manner similar to steps 903-930 of FIG. 9, respectively, except that they are adapted to the etch simulation rather than the resist development process simulator, the input at step 1203 being developed resist distributions instead of optical intensity distributions, and the reference and current critical dimensions corresponding to etched wafer structures rather than developed resist structures.

FIG. 13A illustrates a conceptual side view of an optical exposure system including an illumination system 1302 that causes incident optical radiation 1303 to impinge upon a "thick" mask 1304, with modulated radiation 1306 being projected by a projection system 1308 toward a target structure 1310 such as a resist film to produce a target intensity pattern 1316. According to a preferred embodiment, there is no simplifying assumption that mask 1304 is a two-dimensional entity, and instead the mask 1304 is modeled as being "thick" and comprising a stack of "K" mask layer distribution functions 1312. For purposes of illustrating treatment of incoherent incident spatial frequencies, FIG. 13A illustrates a case in which the incident optical radiation 1303 consists of a single first incident spatial frequency 1305, for which the overall target intensity pattern 1316 corresponds to what is defined herein as a first partial intensity distribution 1314. FIG. 13B illustrates a case in which the incident optical radiation 1303 consists of a single $i^{th}$ incident spatial frequency 1305, for which the target intensity pattern 1316 corresponds to an $i^{th}$ partial intensity distribution 1314. Finally, FIG. 13C illustrates a case in which the incident optical radiation 1303 consists of a number NF of different incident spatial frequencies 1305, for which the target intensity pattern 1316 corresponds to a sum of all NF of the corresponding partial intensity distributions 1314.

Figure 14:
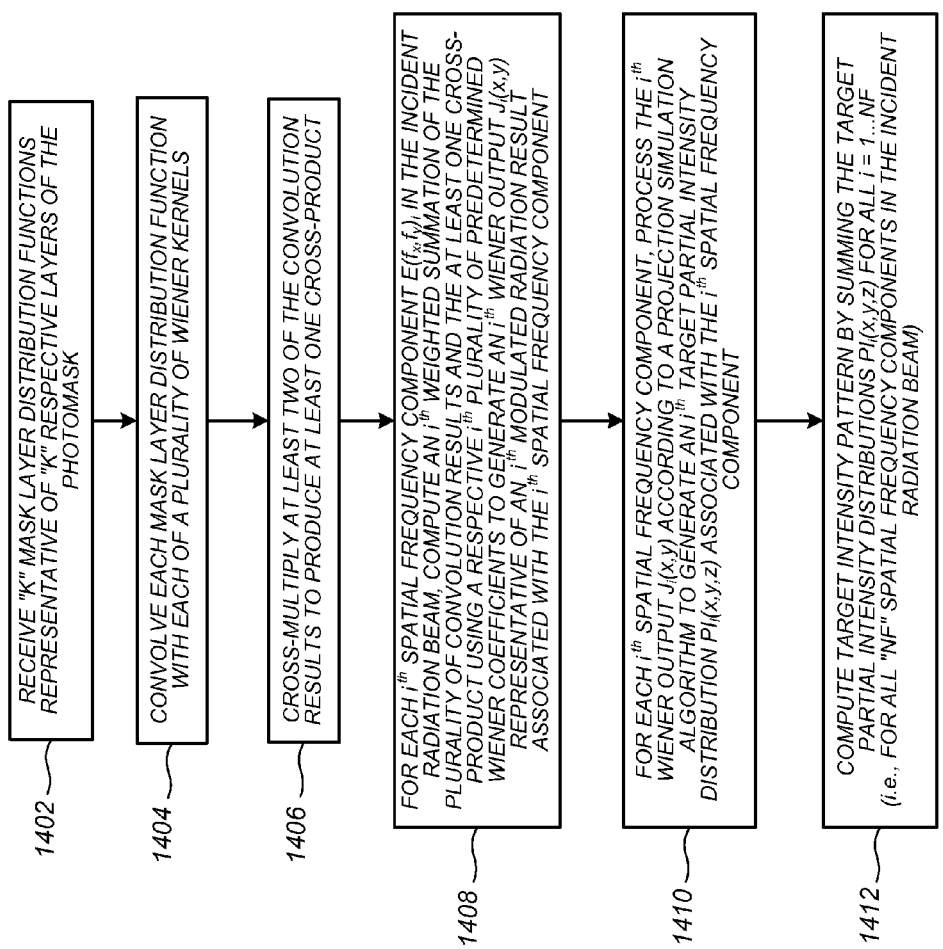
FIG. 14 illustrates simulating modulation of incident radiation by a mask according to a preferred embodiment.

FIG. 14 illustrates simulating an optical exposure system in which optical radiation incident upon a "thick" photomask is modulated thereby and projected toward a target to generate a target intensity pattern, the optical radiation incident upon the photomask comprising a number NV of spatial frequency components. At step 1402, "K" mask layer distribution functions are received representative of "K" respective layers of the "thick" photomask. Respective amplitudes of the NV spatial frequency components are also received. At step 1404, each of the mask layer distribution functions is convolved with each of a plurality of predetermined Wiener kernels to generate a plurality of convolution results, and at step 1406 at least two of the convolution results are cross-multiplied to produce at least one cross-product. At step 1408, for each $i^{th}$ spatial frequency component $E(f_x,f_y)$, in the incident radiation beam, an $i^{th}$ weighted summation of the plurality of convolution results and the at least one cross-product is computed using a respective $i^{th}$ plurality of predetermined Wiener coefficients to generate an $i^{th}$ Wiener output $J_i(x,y)$ representative of an $i^{th}$ modulated radiation result (e.g., near-field diffraction pattern) associated with the $i^{th}$ spatial frequency component. At step 1410, for each $i^{th}$ spatial frequency component, the $i^{th}$ Wiener output $J_i(x,y)$ is processed according to a projection simulation algorithm to generate an $i^{th}$ target partial intensity distribution $PI_i(x,y,z)$ associated with the $i^{th}$ spatial frequency component. Finally, at step 1412, the target intensity pattern is computed by summing all of the target partial intensity distributions for all of the NV spatial frequency components in the incident radiation beam.

Figure 15:
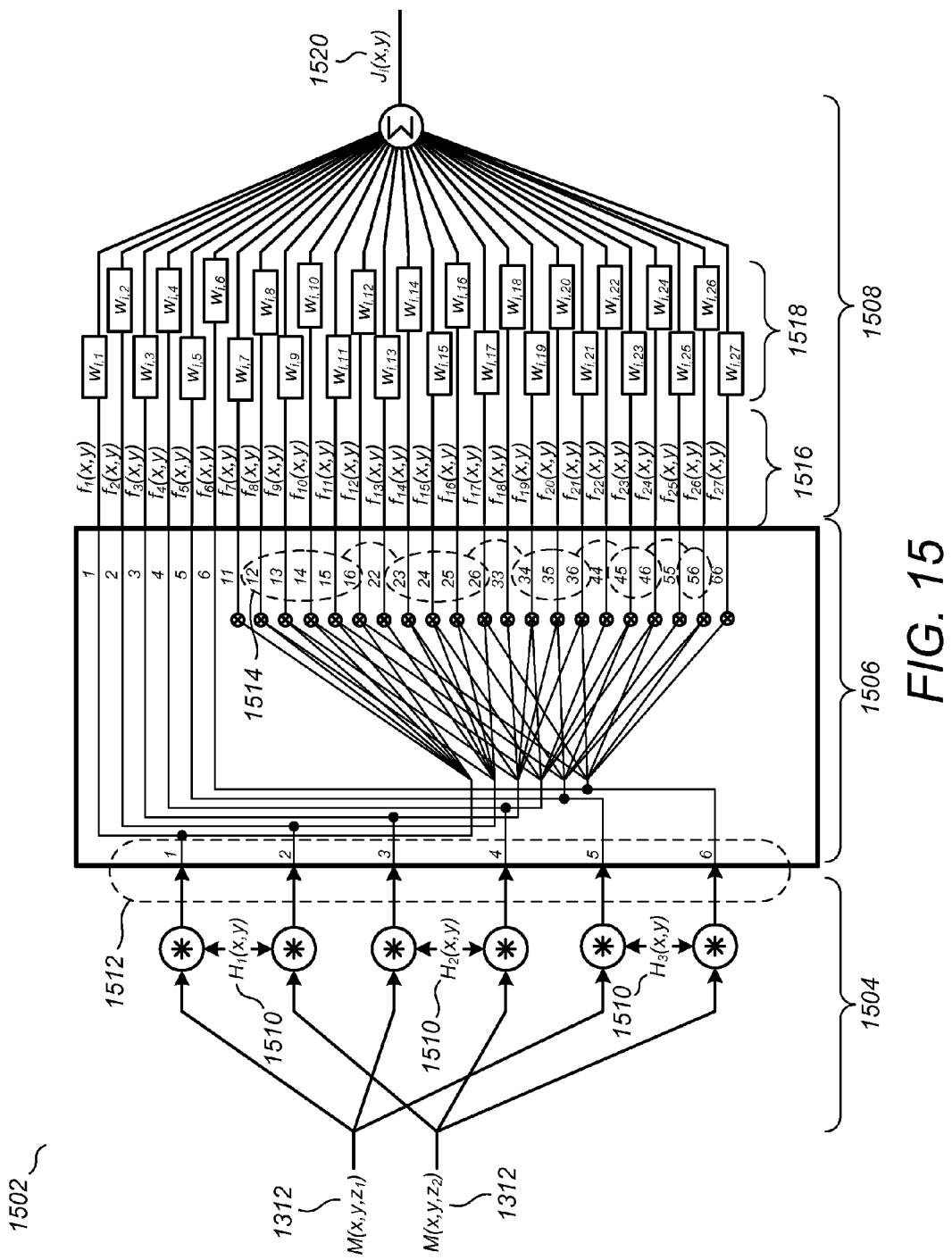
FIG. 15 illustrates a simulation model for modulation of incident radiation by a mask according to a preferred embodiment.

FIG. 15 illustrates a simulation model for "thick-mask" modulation of incident radiation for one spatial frequency according to a preferred embodiment. The model comprises a Wiener operator 1502, with no non-Wiener operator being necessary for this case, the Wiener operator generating a Wiener output 1520 characteristic of the incident electromagnetic radiation as modulated by the mask. The Wiener operator 1502 comprises a convolution operator 1504 that convolves each input mask layer distribution function with each of a plurality of Wiener kernels 1510 to generate a plurality of convolution results 1512, a PCMO 1506 that provides outputs 1516 comprising the convolution results 1512, cross products thereof 1514, and squares of the convolution results 1512 to an LCO 1508 that computes a weighted summation thereof according to a respective plurality of calibrated Wiener coefficients 1518.

Figure 16:
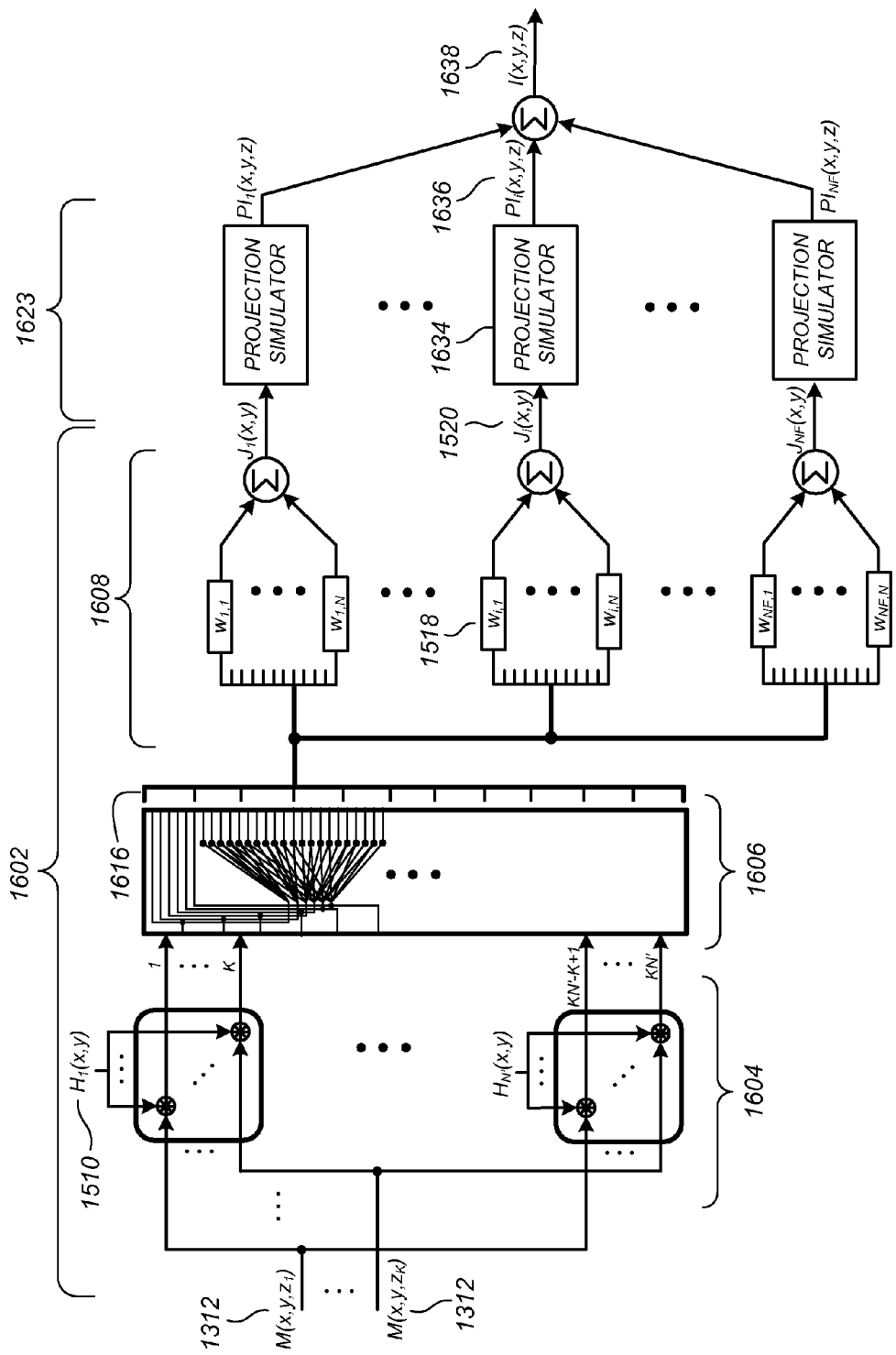
FIG. 16 illustrates an optical exposure system simulation model according to a preferred embodiment.

FIG. 16 illustrates an optical exposure system simulation model according to a preferred embodiment, comprising a Wiener operator 1602 and a projection/summation operator 1623. The Wiener operator 1602 is built upon and highly similar to the Wiener operator 1502 of FIG. 15, comprising a convolution operator 1504 using similar Wiener kernels 1510, a PCMO 1606, and an LCO 1608, except that NF sets of Wiener coefficients 1518 are provided, each set being for a distinct one of the NF spatial frequencies of incident radiation and, preferably, each set being separately calibrated for its respective spatial frequency. The projection/summation operator 1623, which generally has at least one non-Wiener class operator although the scope of the preferred embodiments is not so limited, receives NF Wiener outputs 1520, separately processes them with projection simulators 1634 to generate NF target partial intensity distributions 1636, and sums the NF partial intensity distributions to produce a target intensity distribution 1638. In addition to being generalized to NF spatial frequencies, the preferred embodiment of FIG. 16 is generalized to K mask layer distribution functions 1312 and N' Wiener kernels 1510, in which case the number of convolution results therebetween is equal to KN'.

FIG. 17 illustrates calibrating a simulation model for "thick mask" modulation of incident radiation according to a preferred embodiment and applicable for a particular $i^{th}$ spatial frequency, the radiation modulation simulation corresponding to the model of FIG. 15, the goal being to optimize the Wiener coefficients 1518. At step 1703, a plurality of mask layer distribution functions are received representative of a respective plurality of layers of a test photomask. At step 1713 the mask layer distribution functions and/or other information representative of the test photomask are processed using an antecedent simulation of photomask diffraction for the $i^{th}$ spatial frequency to generate a reference modulated radiation result. The Wiener coefficients 1518 are initialized (step 1716). The K mask layer distribution functions are processed (step 1718) according to the Wiener model 1502 using the current version of the Wiener coefficients 1518 to generate a current version of the Wiener output 1520 that is representative of a current virtual modulation result. At step 1722 the current version of the Wiener output is compared to the reference modulated radiation result, and if sufficiently close at step 1724, the process is complete (step 1730) and the latest version of the Wiener coefficients 1518 constitutes the calibrated Wiener coefficients 1518. If the error metric is not sufficiently small, then at step 1726 a next set of Wiener coefficients 418 is computed based on current version of the Wiener output and the reference modulated radiation result. The step 1718 is then executed for the next set of Wiener coefficients 1518 and the process continues until the sufficiently small error condition is reached. Advantageously, a "thick" mask light modulation simulation system according to the model of FIG. 15 provides for an ability to readily "learn" about a particular "thick" mask from another simulation of that mask.

Figures 18A, 18B:
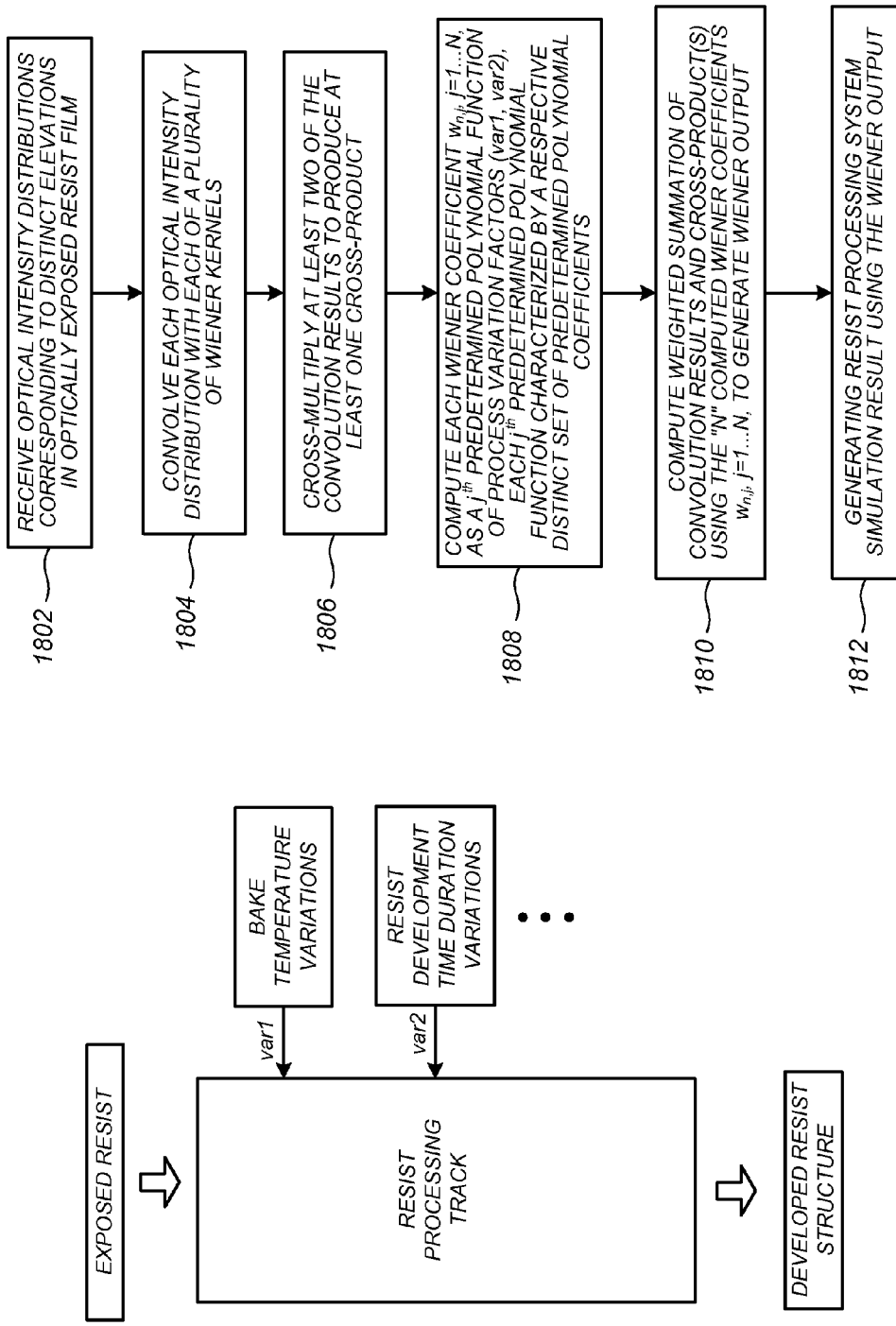
FIG. 18A illustrates a block diagram of a resist processing system having process variations.
FIG. 18B illustrates simulating a resist processing system according to a preferred embodiment.

FIG. 18A illustrates a block diagram of a resist processing system having process variations, with examples of resist processing system variations including bake temperature variations (characterized by a process variation factor "var1") and resist development time variations (characterized by a process variation factor "var2"). The collective resist processing system variations can be characterized by a set of process variation factors represented herein as (var1,var2), although it is to be understood that additional process variation factors can be readily accommodated. According to a preferred embodiment, simulation of the resist processing system can be efficiently achieved such that the number of computations for a number NV of different process variation factor sets, the overall number of computations to generate all NV simulation results is only a fraction of NV times the number of computations for a single simulation result, especially as the number NV grows beyond the low single digits.

FIG. 18B illustrates simulating a resist processing system that undergoes process variations characterized by a plurality of process variation factors according to a Wiener nonlinear model thereof according to a preferred embodiment. A plurality of precomputed optical intensity distributions is received (step 1802) corresponding to a respective plurality of distinct elevations in an optically exposed resist film. Each of the optical intensity distributions is convolved (step 1802) with each of a plurality of predetermined Wiener kernels to generate a plurality of convolution results, and at least two of the convolution results are cross-multiplied (step 1806) to produce at least one cross-product. A first set of process variation factors (var1,var2)$_1$ associated with the processing variations is received. At step 1808, each Wiener coefficient $w_{n,j}$, j=1 ... N, is computed as a $j^{th}$ predetermined polynomial function poly$_{n,j}$(var1,var2), each $j^{th}$ predetermined polynomial function characterized by a respective distinct set of predetermined polynomial coefficients. At step 1810, a Wiener output is computed as a weighted summation of the convolution results and cross-product(s) using the Wiener coefficients $w_{n,j}$, j=1 ... N, and at step 1812, and a resist processing simulation result applicable to the $n^{th}$ developed resist level is computed from the Wiener output. Advantageously, for the next set of process variation factors (var1, var2)$_2$, the steps 1804 and 1806 do not need to be repeated (assuming unchanged optical intensity distributions) to compute the resist processing simulation result, and rather only the steps 1808-1812 need to be computed. Because the relatively onerous convolution step 1804 does not need to be repeated, the same convolution results from before being re-used, substantial computation time is saved for each additional set of process variation factors.

Figure 19:
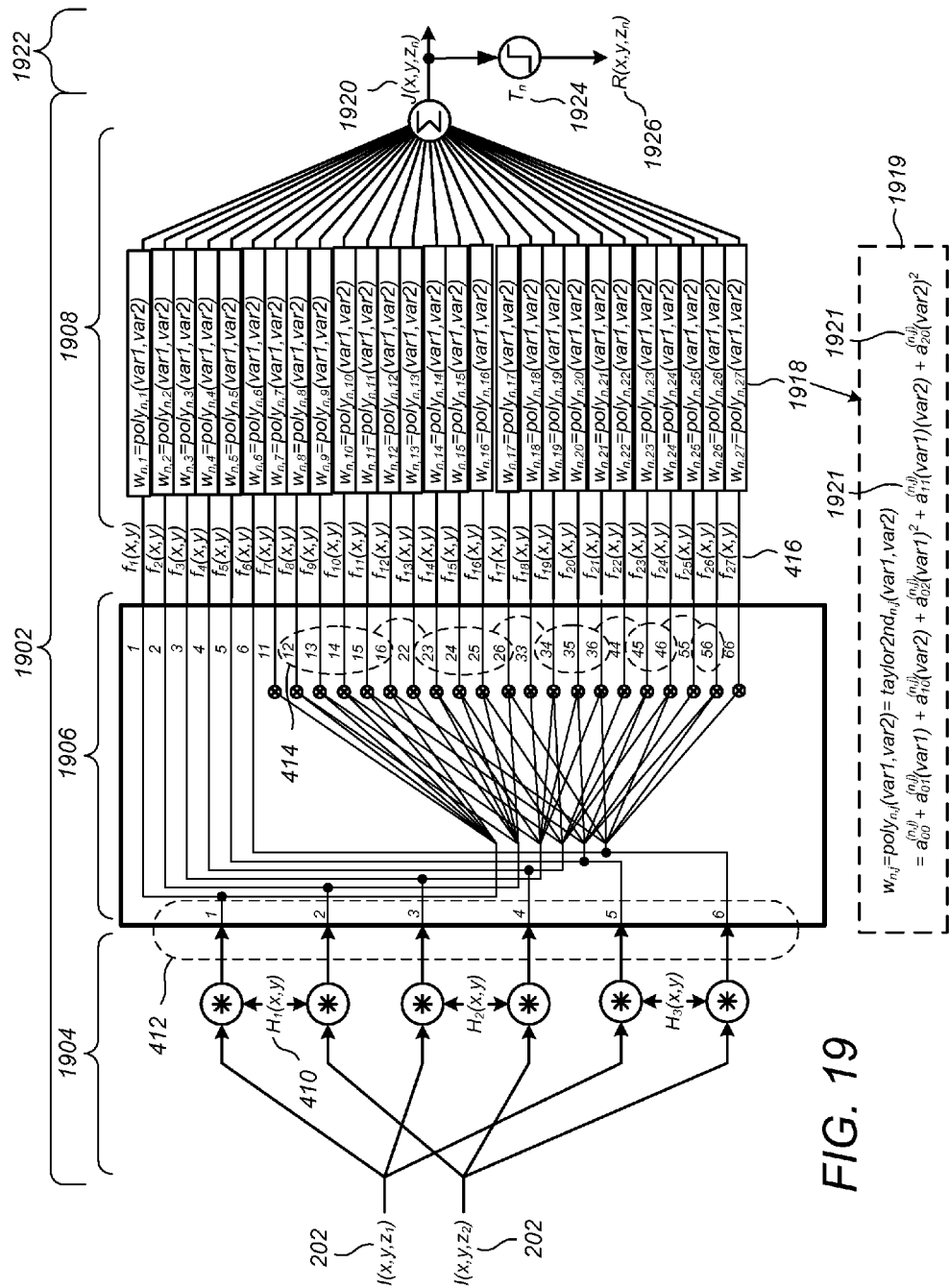
FIG. 19 illustrates a resist processing system simulation model according to a preferred embodiment.

FIG. 19 illustrates a resist processing system simulation model that accommodates process variations according to a preferred embodiment. The model comprises a serial combination of a Wiener operator 1902 that generates a Wiener output 1920 and a non-Wiener operator 1922 (a threshold operator with threshold 1924) that generates a resist processing system simulation result 1926. The Wiener operator 1902 comprises a convolution operator 1904, a PCMO 1906, and an LCO 1908 and is similar to the Wiener operator 402 of FIG. 4 with the exception that each of its Wiener coefficients 1918 (i.e., $w_{n,j}$, j=1...N) is computed as polynomial function $poly_{n,j}$(var1,var2) having its own set of unique polynomial coefficients. For one preferred embodiment, the polynomial function $poly_{n,j}$(var1,var2) is a relatively low order Taylor series 1919, such as a second order Taylor series having Taylor coefficients 1921, although higher order Taylor series or other types of expansions are not outside the scope of the preferred embodiments. Although shown for a single elevation $z_n$ in the resultant etched wafer structure, the model is readily extended to a plurality J of elevations in the resultant etched wafer structure, in a manner similar to the way the single developed resist level model of FIG. 4 is extended to the multiple developed resist level model of FIG. 7.

Figure 20:
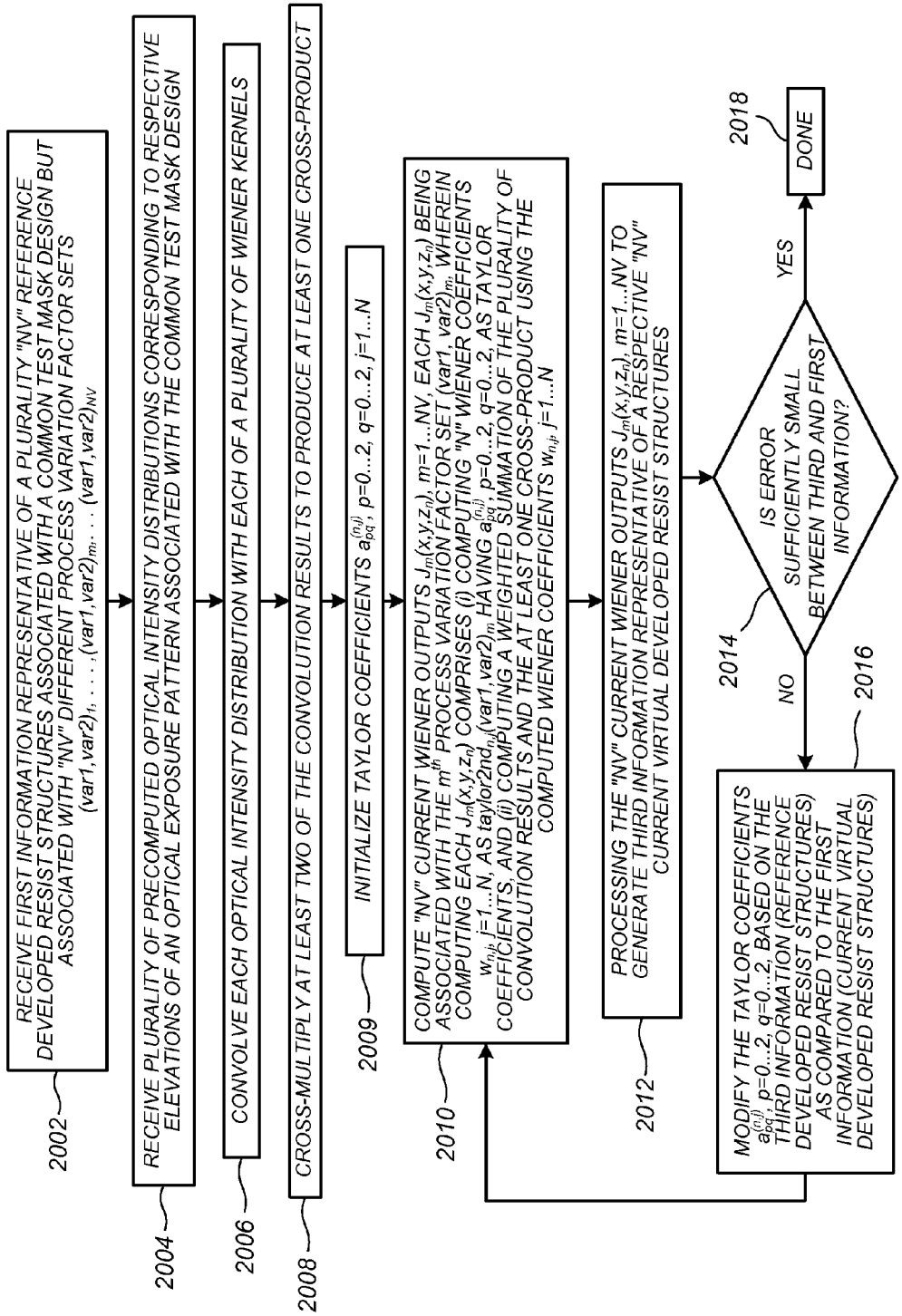
FIG. 20 illustrates calibrating a resist processing system simulation according to a preferred embodiment.

FIG. 20 illustrates calibrating a resist processing system simulation that accommodates process variations according to a preferred embodiment, the resist processing system simulation corresponding to the model of FIG. 19, the goal being to optimize the Taylor coefficients 1921. At step 2002, first information is received representative of a plurality NV reference developed resist structures associated with a common test mask design but associated with NV different process variation factor sets $(var1, var2)_1, \ldots, (var1, var2)_m, \ldots (var1, var2)_{NV}$. At step 2004, a plurality of precomputed optical intensity distributions are received corresponding to respective elevations of an optical exposure pattern associated with the common test mask design. At step 2006, each optical intensity distribution is convolved with each of a plurality of Wiener kernels, and at step 2008 at least two of the convolution results are cross-multiplied to produce at least one cross-product. At step 2009, the Taylor coefficients 1921 are initialized. At step 2010, NV current Wiener outputs $J_m(x, y, z_n)$, m=1 ... NV, are computed, each $J_m(x,y,z_n)$ being associated with the $m^{th}$ process variation factor set $(var1, var2)_m$, wherein computing each $J_m(x,y,z_n)$ comprises (i) computing N Wiener coefficients $w_{n,j}$, j=1...N, as a second order Taylor expansion of $(var1, var2)_m$ the Taylor coefficients 1921, and (ii) computing a weighted summation of the plurality of convolution results and the at least one cross-product using the computed Wiener coefficients $w_{n,j}$, j=1...N. At step 2012, the current Wiener outputs $J_m(x,y,z_n)$, m=1 ... NV are processed to generate third information representative of a respective NV current virtual developed resist structures. If an error condition between the third and first information is sufficiently small at step 2014, then the process is complete (step 2018) and the latest version of the Taylor coefficients 1921 constitutes the calibrated Taylor coefficients 1921. If the error metric is not sufficiently small, then at step 2016 a next set of Taylor coefficients 1921 is computed based on the third information (reference developed resist structures) as compared to the first information (current virtual developed resist structures). The step 2010 is then executed for the next set of Taylor coefficients 1921 and the process continues until the sufficiently small error condition is reached.

Whereas many alterations and modifications of the present invention will no doubt become apparent to a person of ordinary skill in the art after having read the descriptions herein, it is to be understood that the particular preferred embodiments shown and described by way of illustration are in no way intended to be considered limiting. By way of example, also within the scope of the preferred embodiments is simulating a resist processing system based on a closed-form mathematical model of the resist processing system. A plurality of precomputed optical intensity distributions is received corresponding to a respective plurality of distinct elevations in an optically exposed resist film, and each of the optical intensity distributions is filtered with each of a plurality of predetermined filters to generate a plurality of filtering results, the predetermined filters corresponding to the closed-form mathematical model. At least one nonlinear function of at least two of the filtering results is generated to produce at least one nonlinear result. A weighted combination of the plurality of filtering results and the at least one nonlinear result is computed using a respective plurality of predetermined weighting coefficients associated with the closed-form mathematical model to generate a model output, and a resist processing system simulation result is generated based at least in part on the model output.

By way of even further example, also within the scope of the preferred embodiments is calibrating a plurality of weighting coefficients for use in a closed-form mathematical model-based computer simulation of the resist processing system. First information representative of a reference developed resist structure associated with a test mask design is received. Second information representative of a plurality of precomputed optical intensity distributions corresponding to respective distinct elevations of an optical exposure pattern associated with the test mask design are received. Each of the optical intensity distributions is filtered with each of a plurality of predetermined filters associated with the closed-form mathematical model to generate a plurality of filtering results. At least one nonlinear function of at least two of the filtering results is generated to produce at least one nonlinear result. The plurality of weighting coefficients are initialized. A current model output is generated by computing a weighted combination of the plurality of filtering results and the at least one nonlinear result using the plurality of weighting coefficients. The current model output is processed to generate third information representative of a current virtual developed resist structure, and the plurality of weighting coefficients is modified based on the first information and the third information. The current model is recomputed using the modified weights, and the process continues until a sufficiently small error condition is reached between the third information and the first information, at which point the latest version of the modified weights constitute the calibrated weights.

By way of still further example, also within the scope of the preferred embodiments is simulating an etch processing system based on a closed-form mathematical model of the etch processing system. A plurality of developed resist distributions associated with a precomputed developed resist structure is received, and each of the developed resist distributions is filtered with each of a plurality of predetermined filters to generate a plurality of filtering results, the predetermined filters corresponding to the closed-form mathematical model. At least one nonlinear function of at least two of the filtering results is generated to produce at least one nonlinear result. A weighted combination of the plurality of filtering results and the at least one nonlinear result is computed using a respective plurality of predetermined weighting coefficients associated with the closed-form mathematical model to generate a model output, and an etch processing system simulation result is generated based at least in part on the model output.

By way of even further example, also within the scope of the preferred embodiments is calibrating a plurality of weighting coefficients for use in a closed-form mathematical model-based computer simulation of the etch processing system. First information representative of a reference etched wafer structure associated with a test developed resist structure. Second information representative of a plurality of developed resist distributions corresponding to respective distinct elevations of the test developed resist structure are received. Each of the developed resist distributions is filtered with each of a plurality of predetermined filters associated with the closed-form mathematical model to generate a plurality of filtering results. At least one nonlinear function of at least two of the filtering results is generated to produce at least one nonlinear result. The plurality of weighting coefficients are initialized. A current model output is generated by computing a weighted combination of the plurality of filtering results and the at least one nonlinear result using the plurality of weighting coefficients. The current model output is processed to generate third information representative of a current virtual etched wafer structure, and the plurality of weighting coefficients is modified based on the first information and the third information. The current model is recomputed using the modified weights, and the process continues until a sufficiently small error condition is reached between the third information and the first information, at which point the latest version of the modified weights constitute the calibrated weights. Therefore, reference to the details of the preferred embodiments are not intended to limit their scope, which is limited only by the scope of the claims set forth below.

The instant specification continues on the following page. General Wiener System Modeling of Nonlinear and Dispersive Processes In system theory, the concept of a system is a powerful mathematical abstraction of a natural or man-made process or structure that may be interpreted as a signal processing or data transforming block, which takes an input signal or data and produces an output signal or data, in accordance with a particular rule of transformation or correspondence. Mathematically, the input and output signals or data are represented by functions or distributions defined on coordinated sets $\Omega$ and $\Omega'$ respectively. In practice, the coordinated sets $\Omega$ and $\Omega'$ are often regions of or the entire, one-, two- or three-dimensional real space and/or the time continuum. The coordinated sets $\Omega$ and $\Omega'$ may be the same, but often different, although both need to share and embed a common nonempty set, denoted as $\Omega \wedge \Omega'$. More specifically, for some integer $d > 0$, and $p \geq d$, $q \geq d$, $$\Omega \wedge \Omega' \stackrel{def}{=} \left\{ (x^{(1)}, \ldots, x^{(d)}) \middle| \begin{array}{l} \exists x^{(d+1)}, \ldots, x^{(p)} \in R, \\ s.t. (x^{(1)}, \ldots, x^{(d)}, x^{(d+1)}, \ldots, x^{(p)}) \in \Omega, \\ \exists x^{(d+1)}, \ldots, x^{(q)} \in R, \\ s.t. (x^{(1)}, \ldots, x^{(d)}, x^{(d+1)}, \ldots, x^{(q)}) \in \Omega' \end{array} \right\} \quad (1)$$

regarding different permutations of the coordinate variables as equivalent. The rule of trans-formation or correspondence has to be a mapping in the strict mathematical sense, that is, any legitimate input has to be mapped into an output, and no two outputs can correspond to (be mapped to from) the same input. The spaces of all possible input and output functions or distributions, usually being $\mathcal{D}(\Omega) \subset L^m(\Omega)$, $m > 0$, and $\mathcal{R}(\Omega') \subset L^{m'}(\Omega')$, $m' > 0$, respectively, are called the domain and range of the mapping, where $L^m(\Omega)$ denotes the space of functions or distributions on $\Omega$ whose absolute value raised to the mth power is Lebesgue integrable. A system is completely characterized and determined by its rule of transformation and the domain and range of its input and output signals or data. From the mathematical point of view, a system is just a functional or operator as studied in the theory of functional analysis. A system is called linear if it is represented by a linear functional or operator, and nonlinear when the associated functional or operator is nonlinear, although in the general sense, linear systems are included as special cases in the class of nonlinear systems.

The class of Wiener systems encompasses a large variety of natural or man-made processes or structures [For general references of Wiener systems, see for example, M. Schetzen, *The Volterra and Wiener Theories of Nonlinear Systems*, Wiley, New York, 1980; M. Schetzen, "Nonlinear System Modeling Based on the Wiener Theory," *Proc. IEEE*, vol. 69, no. 12, pp. 1557-1573, December 1981; and W. J. Rugh, *Nonlinear System Theory: The Volterra/Wiener Approach*, Johns Hopkins University Press, 1981, web version prepared in 2002]. Roughly speaking, a system is Wiener when it is shift-invariant and finitely dispersive. $\forall t \in \Omega \wedge \Omega'$, let $E_t$ be the coordinate shift operator associated with t, that is, $E_t[X(x)] = X(x+t)$, $\forall X \in \mathcal{D}(\Omega)$, and $E_t[Y(y)] = Y(y+t)$, $\forall Y \in \mathcal{R}(\Omega')$, where $\forall x \in \Omega$ and $\forall y \in \Omega'$, x+t and y+t are interpreted as having t filled with zeros for the coordinate components that are out of $\Omega \wedge \Omega'$. A system is called shift-invariant when its associated operator T commutes with all coordinate shift operators, $\forall t \in \Omega \wedge \Omega'$, namely, $$TE_t = E_t T, \forall t \in \Omega \wedge \Omega'. \quad (2)$$

$\forall y \in \Omega'$, let $y|_\Omega$ denote the projection of y onto $\Omega$, namely, $y|_\Omega$ is a point in $\Omega$, which shares exactly the same coordinates with y for the dimensions of $\Omega \wedge \Omega'$, and has all zeros for the rest of coordinate components out of $\Omega \wedge \Omega'$. Similarly, $\forall x \in \Omega$, let $x|_{\Omega'}$ denote the projection of x onto $\Omega'$. A system T is said to be non-dispersive if $\forall X \in \mathcal{D}(\Omega)$, $\forall y \in \Omega'$, the output signal value $T[X](y)$ depends only on the value of $X(y|_\Omega)$, and is independent of the values of X at all other locations $x \neq y|_\Omega$. By contrast, a system T is called finitely dispersive, when either 1) $\forall X \in \mathcal{D}(\Omega)$, $\forall y \in \Omega'$, the output signal value $T[X](y)$ depends only on values of X at points within a finitely sized vicinity of $y|_\Omega$, namely, $\mathcal{V}_A(y|_\Omega) \stackrel{def}{=} \{x \in \Omega | \|x-(y|_\Omega)\| < A\}$, where $\|\cdot\|$ is a suitable norm in the coordinated set $\Omega$, $A > 0$ is finite and called the "dispersion ambit"; or 2) the dependence of $T[X](y)$ on $X(x)$ decays sufficiently fast as $\|x-(y|_\Omega)\|$ increases, that the dependence may be truncated up to a $\mathcal{V}_A(y|_\Omega)$, and assumed to completely vanish at points beyond $\mathcal{V}_A(y|_\Omega)$, while the induced error due to such truncation can be made arbitrarily small uniformly $\forall y \in \Omega'$, by choosing a sufficiently large, but finite, dispersion ambit A.

In practice, non-dispersive systems are rare, while linear and dispersive systems are often merely approximations to actually nonlinear ones. Both the linear and dispersive systems and the nonlinear and non-dispersive systems are amenable to simple mathematical solutions and efficient numerical simulations. A large variety of natural or man-made processes or structures are Wiener systems, and most of them are nonlinear and dispersive, as well as continuous. The significance for a Wiener system to have a continuous operator will be soon clear. It is the combination of nonlinearity and dispersion that makes such Wiener systems more interesting and useful, while far more difficult to solve mathematically or numerically using computer simulations. One early theoretical development that made Wiener systems mathematically tractable is due to Maurice Fréchet, who extended the well-known Weierstrass theorem on approximating continuous functions with polynomials to functionals and operators, and showed that, any continuous functional T on a compact domain $\mathcal{D}(\Omega)$ can be approximated by a uniformly convergent series of functionals of integer orders. Namely, given a continuous functional T on a compact domain $\mathcal{D}(\Omega)$, for an arbitrarily small $\epsilon > 0$ of error tolerance, there exists a finite integer $N(\in)>0$ and a sum of functionals of orders $n=1, 2, \ldots, N(\in)$, which approximates T with an error smaller than $\in$, for all input signals (functions) in the compact domain $\mathcal{D}(\Omega)$. Another early mathematical development providing a convenient tool to analyze Wiener systems is due to Vito Volterra, who suggested that any functional $T_n[X]$ of an integer nth order be represented by an n-fold convolution as, $$T_n[X(x)] = \int_{\Omega \wedge \Omega'} \ldots \int_{\Omega \wedge \Omega'} h(x'_1, x'_2, \ldots, x'_n) X(x-x'_1) X(x-x'_2) \ldots X(x-x'_n) dx'_1 dx'_2 \ldots dx'_n. \quad (3)$$

A functional in the form of equation (3) is called a Volterra functional, where the integral or convolution kernel $h(x_1, x_2, \ldots, x_n)$, $x_i \in \Omega \wedge \Omega'$, $\forall i \in [1, n]$ is called the Volterra kernel of the functional or system. A (possibly infinite) sum of Volterra functionals with increasing orders is called a Volterra series. It can be shown that functionals of integer orders and Volterra functionals are equivalent. Therefore, Fréchet's theorem states that any continuous functional can be approximated by a Volterra series that converges uniformly over a compact domain $\mathcal{D}(\Omega)$.

Although Volterra functionals and series provide convenient and rigorous mathematical tools for representing and analyzing Wiener systems, their applications in numerical modeling and simulations are rather limited. One major difficulty stems from the multi-dimensionality of Volterra kernels of orders higher than one. For system identification, determining a higher-order Volterra kernel requires a large amount of measurements. Moreover, storing a higher-order Volterra kernel as a multi-dimensional array of numerical data can be expensive to impractical, and numerically evaluating a multi-dimensional integral as in equation (3) involves a high computational complexity. In the 1950's, Norbert Wiener developed a set of techniques and theory on representing, identifying, and realizing a class of nonlinear systems. The class of nonlinear systems, the mathematical theory, and the modeling methodology are all called Wiener in recognition of his contributions.

The Wiener methodology may be best understood by starting with a truncated Volterra series of a finite order that approximates a given continuous Wiener system, better than a given error tolerance $\in > 0$, over a compact domain $\mathcal{D}(\Omega)$ of input signals. The $L^m$ norm of the input signals is necessarily upper-bounded due to the compactness of $\mathcal{D}(\Omega)$. The domain $\mathcal{D}(\Omega)$ is a compact Hilbert space under, for example, the $L^2$ norm, which admits representations using uniformly convergent series of orthonormal functions. More specifically, with any chosen basis of orthonormal functions $\{H_k(x)\}_{k=1}^{\infty}$, defined on $\Omega \wedge \Omega'$, for any given error tolerance $\delta > 0$, there exists a finite integer $K > 0$, such that any function in the compact domain $\mathcal{D}(\Omega)$ can be approximated by a linear combination of the first K orthonormal functions $\{H_k(x)\}_{k=1}^{K}$, with the $L^2$ approximation error less than $\delta$. Then it can be showed that any Volterra kernel $h(x_1, x_2, \ldots, x_n)$ of order n can be approximated by a linear combination (called a "polyorthogonal") of various products (called "monorthogonals") of n orthogonal functions among $\{H_k(x)\}_{k=1}^{K}$ to an $L^2$ error upper-bounded by $O(n\delta)$. More specifically, a Volterra kernel $h(x_1, x_2, \ldots, x_n)$, $n \geq 1$ can be approximated as, $$h(x_1, x_2, \ldots, x_n) \approx \sum_{1 \leq k_1, k_2, \ldots, k_n \leq K} c_{k_1 k_2 \ldots k_n} H_{k_1}(x_1) H_{k_2}(x_2) \ldots H_{k_n}(x_n), \quad (4)$$

with the coefficients being calculated from functional inner-products, $$c_{k_1 k_2 \ldots k_n} = \int_{\Omega \wedge \Omega'} \ldots \int_{\Omega \wedge \Omega'} h(x_1, x_2, \ldots, x_n) H_{k_1}(x_1) H_{k_2}(x_2) \ldots H_{k_n}(x_n) dx_1 dx_2 \ldots dx_n. \quad (5)$$

It is noted that the orthogonal functions in the inner-product calculations may need to be complex-conjugated when the functions are complex-valued. By combining the mathematical results, one can prove the following Theorem of Wiener Representability:

With any chosen basis of orthonormal functions $\{H_k(x)\}_{k=1}^{\infty}$, called Wiener kernels, for any continuous Wiener system $T: \mathcal{D}(\Omega) \to \mathcal{R}(\Omega')$, $\mathcal{D}(\Omega)$ being compact, and for any given error tolerance $\in > 0$, there exists two finite integers $K > 0$ and $N > 0$, such that the Wiener system T can be approximated, i.e., represented by the following closed-form formula, $$T[X] \approx \sum_{n=1}^{N} \left[ \sum_{1 \leq k_1, k_2, \ldots, k_n \leq K} w_{k_1 k_2 \ldots k_n} (H_{k_1} \star X)(H_{k_2} \star X) \ldots (H_{k_n} \star X) \right], \quad (6)$$

with the approximation error upper-bounded by $\in$ uniformly $\forall X \in \mathcal{D}(\Omega)$.

Where in equation (6), $\forall k \in [1, K]$, $H_k \star X$ represents a conventional (single-fold) convolution as, $$[H_k \star X](y) \stackrel{def}{=} \int_{\Omega \wedge \Omega'} H_k(x') X(y|_{\Omega} - x') dx', \forall y \in \Omega', \quad (7)$$

and $\forall n \in [1, N]$, $\forall (k_1, k_2, \ldots, k_n)$, the convolution results in the parentheses are point-wise (in $\Omega'$ coordinate) multiplied and weighted by a scalar "Wiener coefficient" $w_{k_1 k_2 \ldots k_n}$.

In practice, the importance of the Theorem of Wiener Representability is to provide a theoretical guarantee that a finite Wiener representation of the form in equation (6), with a predetermined set of orthonormal functions, always exists for a continuous Wiener system over a compact set of input signals. A practical procedure of system identification can then focus on determining the Wiener coefficients. It is noted that the set of orthonormal functions can be arbitrary in principle, and independent (i.e., determined before knowing the full characteristics) of the system being modeled, although a set orthonormal functions possessing a certain symmetry may be better preferred than others, in view of an intrinsic symmetry in the system. Most real physical or chemical processes are continuous, barring chaotic ones. Indeed, many systems to be modeled are well designed and controlled processes that are used for industrial productions. Their stability against input and other perturbations is optimized and/or proven, which is to say that the systems manifest good continuity. Furthermore, the response of a system may often be well, sometimes even exactly, characterized by a lower-order nonlinearity; or a system is often operated in a weakly nonlinear regime, where its response is dominated by a linear term, with a few lower-order nonlinear terms added perturbatively. In practice, with the highest order of nonlinearity $N > 0$ fixed, and having a finite set of Wiener kernels $\{H_k(x)\}_{k=1}^{K}$ selected, a Wiener system represented as in equation (6) is completely characterized and uniquely determined by the set of Wiener coefficients $\{w_{k_1 k_2 \ldots k_n}\}_{1 \leq k_1, k_2, \ldots, k_n \leq K; 1 \leq n \leq N}$. In other words, the Wiener system is nothing but the set of Wiener coefficients. A procedure of system identification needs only to find the optimal values for the Wiener coefficients, so that the responses of the (usually computer-numerically) synthesized Wiener system as in equation (6) best fit the measured outputs from a system being modeled, for a selected set of input excitations. For this reason, the procedure of system identification is called model calibration of a Wiener system. As well known in the art, iterative numerical algorithms, such as Landweber-type iteration procedures, and in particular the projected Landweber method, can be used to compute the optimal Wiener coefficients in model calibrations of Wiener systems. (See, for example, L. Landweber, "An Iteration Formula for Fredholm Integral Equations of the First Kind," *Am. J. Math.*, vol. 73, no. 3, pp. 615-624, 1951; M. Plana and M. Bertero, "Projected Landweber method and preconditioning," *Inverse Problems*, vol. 13, pp. 441-463, 1997.)

According to equation (6), a closed-form Wiener system can be computer-simulated or otherwise realized in three cascaded blocks of signal processing, where the first block linearly filtering the input signal by convolving the input with the Wiener kernels to produce convolution results, then the second block cross-multiplies the convolution results in a coordinate point-wise manner to generate cross-products (also called Wiener products), finally the third block linearly combines the cross-products as weighted by the Wiener coefficients. Each of the three blocks of signal processing can be implemented rather efficiently. In particular, the convolution operations in the first block may use fast Fourier transforms (FFTs) and their inverses and be implemented as point-wise multiplications in the Fourier domain. Therefore, one advantage of Wiener modeling is the high numerical efficiency, namely, high speed in computer simulations, when compared to the iterative and differential-equation-solving methods known in the art, which do not have a closed-form formula to use, but rely on numerical equation solvers such as finite element methods (FEMs), finite difference methods, and finite-difference time-domain (FDTD) methods in particular. More importantly, a closed-form Wiener model is particularly useful to deal with a variable Wiener system. A nonlinear and dispersive (i.e., Wiener) system may be variable when one or a plurality of its physical or chemical parameters is/are varying. Such varying physical or chemical parameters are called variation variables (VarVars). Since a Wiener system is completely characterized and uniquely determined by the corresponding Wiener coefficients, its variability is reflected, and only present, in the Wiener coefficients, which become functions of the variation variables. For a variable Wiener system, the closed-form representation becomes, $$T(\text{var})[X] \approx \sum_{n=1}^{N} \left[ \sum_{1 \le k_1, k_2, \ldots, k_n \le K} w_{k_1 k_2 \ldots k_n}(\text{var})(H_{k_1} * X)(H_{k_2} * X) \ldots (H_{k_n} * X) \right], \quad (8)$$

with var denoting the collection of variation variables, which is automatically in the so-called convolution-variation separated (CVS) format. As being disclosed in previous patent specifications of ourselves, representing a variable system in a CVS format endues the mathematical model with great advantages in simulating the variable system very efficiently. Such advantages are not shared by the iterative and differential-equation-solving methods known in the art. In particular, once the convolution results and the cross-products are computed to generate the output at one variation condition, either the convolution results or the cross-products can be stored. When it is necessary to generate the system response to the same input but at a varied condition with a change of value in the variation variables, no convolution operation needs to be repeated, only the Wiener coefficients ought to be evaluated to weight and combine the Wiener products, which are stored or otherwise quickly computed from stored convolution results.

Furthermore, the functional dependence of each of the Wiener coefficients on the variation variables may be represented by, for example, a multi-variable polynomial (MVP). Because the Wiener coefficients often vary slowly as the variation variables change in suitable ranges, especially when the change of variation variables is perturbative and causes a small variation of the system, it may be sufficient to represent the variable Wiener coefficients by low-order multi-variable polynomials (also called low-order many-variable polynomials) of the variation variables. The coefficients of the MVPs representing the variable Wiener coefficients may be determined or calibrated by using multiple sets of output responses to the same set of input excitations under different values of variation variables, where the multiple sets of output responses may be either measured from the actual system being modeled, or extracted from another computer simulator modeling the actual system. In essence, the procedure of determining or calibrating the coefficients of MVPs representing the variable Wiener coefficients is to calibrate and generate a variable Wiener model, which can be used to predict the system response under changing values of variation variables.

Applications of Wiener System Modeling in Lithography Simulations

The process of resist exposure and development can be modeled by a Wiener system having a three-dimensional (3D) optical intensity distribution (e.g., multiple two-dimensional (2D) optical images at different depths) as input, and multiple 2D images as output, which upon the application of thresholds, or a single common threshold, generate contour curves defining the boundaries of developed resist structures at different depths or heights. It is important to describe the input signal to the step of photoresist exposure and development using a representation of 3D intensity distribution in the resist film, so that the process step may be formulated as a Volterra-Wiener nonlinear system, which is described with mathematical rigor by a nonlinear functional that transforms the input signal of 3D intensity to the output signal of 3D resist topography. In practice, the 3D intensity distribution may be represented by a finite number of 2D images at different depths within the resist, while the topography of developed resist may be described by an array of contour plots obtained when the 3D resist is cross-sectioned by a set of parallel planes at different heights. Mathematically, each contour plot at a specific height may be viewed as being generated by thresholding a continuous 2D signal distribution as an intermediate result, which is produced by a Volterra-Wiener nonlinear system taking the vector of 2D optical images in resist as input. In this way, each contour plot is associated with a Volterra-Wiener model, and the discretely sampled 3D topography of developed resist is associated with a vector of Volterra-Wiener models.

Multiple sets of contour curves delineating edges or walls of 3D structures of developed resist at different depths (e.g., on the top, in the middle, and at the bottom, respectively), or selected points on such sets of contour curves, may be obtained through either metrology of real wafer results or simulations using a differential first-principle model. Each set of contour curves corresponds to, may be considered as the result of, and could be used to calibrate, one Wiener nonlinear model/process with the same input of 2D image samples, followed by a threshold step at the end. The threshold may be chosen, for example, as the arithmetic mean, or least-square mean of 2D image intensities on a set of contour curves or selected points on them, with both the 2D image and the set of contour curves being at the same or similar depth. Or the threshold may be chosen to minimize the least-square error of resist edge/wall placement. A set of calibrated Wiener nonlinear models may then be used to predict multiple sets of contour curves of developed resist at different depths, rapidly and over a large area of an actual chip to be fabricated. Such Wiener models are able to accurately predict 3D resist topography, such as top critical dimensions (CDs), bottom CDs, side-wall slopes, and even barrel-shaped or pincushion-shaped cross sections of resist structures.

Using such Wiener model of resist chemistry, the input optical images are convolved with Wiener kernels to generate convolution results (CRs). The CRs are combinatorially cross-multiplied to yield Wiener products (WPs), which may be enumerated as $\{WP_n(x, y)\}_{n=0}^{N}$, and weighted respectively by the so-called Wiener coefficients (WCs) $\{w_n\}_{n=0}^{N}$, then summed together to produce an output image $I_o(x, y)$, $$I_o(x, y) = \sum_{n=0}^{N} w_n WP_n(x, y), \tag{9}$$

which is threshold-decided to generate a binary-valued image approximating the developed resist patterns. In particular, the edge points with $I_o$ valued at the threshold level form contour lines as boundaries defining the resist patterns. A test wafer pattern may be measured, and if some of the contour lines, or selected points on the contour lines, are obtained, then the Wiener model, actually the Wiener coefficients, would be conveniently calibrated using the measured data. In practice, however, the measurement results are often reported in the form of CD lengths, that are relative distances between opposite pattern boundaries (contour lines). No specific coordinates of contour points are available. Under such circumstances, one may firstly have a single Gaussian kernel and a constant threshold optimized and staying fixed; then use the optimized Gaussian "waist" for all Laguerre-Gaussian Wiener kernels, compute and derive all CRs and WPs, as well as the spatial derivatives, namely, slopes (SLs) of the WPs, all of which are also fixed, so long as the input optical images remain the same; finally use the WPs and their slopes to construct a linearized formulation of CD errors as functions of the Wiener coefficients, and iteratively optimize the WCs using the projected Landweber method.

Using the language of mathematical induction, one may suppose that, at the kth iteration step of a projected Landweber procedure, $k \geq 0$, the Wiener model has coefficients $\{w_n\}_{n=0}^{N}$, and predicts the following output image and its spatial slope, $$I_o^{(k)}(x, y) = \sum_{n=0}^{N} w_n^{(k)} WP_n(x, y), \tag{10}$$

$$SL^{(k)}(x, y) = \sum_{n=0}^{N} w_n^{(k)} SL_n(x, y). \tag{11}$$

Let the measured CDs be enumerated as $\{CDM_m\}_{m=1}^{M}$, at whose locations the Wiener model predicts simulated CDs $\{CDS_m^{(k)}\}_{m=1}^{M}$ from the Wiener output image $I_o^{(k)}(x, y)$, together with the coordinates $(x_m, y_m)$ and $(x'_m, Y'_m)$ of the two end points of each simulated CD, as well as the spatial slopes $SL^{(k)}(x_m, y_m)$ and $SL^{(k)}(x'_m, y'_m)$, $\forall m \in [1, M]$. The slopes, namely, directional gradients, $SL^{(k)}(x_m, y_m)$ and $SL^{(k)}(x'_m, y'_m)$ at the end points of $CDS_m^{(k)}$ are defined to be always pointing toward the center of the simulated CD, regardless of the interested pattern being "white" (having $I_o^{(k)}$ valued above threshold) or "black" (having $I_o^{(k)}$ valued below threshold).

That is, when a slope, either $SL^{(k)}(x_m, y_m)$ or $SL^{(k)}(x'_m, y'_m)$, is approximated by a finite difference, one always takes the $I_o^{(k)}$ value of a point inside the simulated CD subtracting the $I_o^{(k)}$ value of a point outside, with both points being in proximity to the interested end point, $(x_m, y_m)$ or $(x'_m, y'_m)$.

The projected Landweber procedure at the kth iteration step is to find the best perturbations $\{\delta w_n^{(k)}\}_{n=0}^{N}$ to the Wiener coefficients $\{w_n^{(k)}\}_{n=0}^{N}$, so to obtain the renewed Wiener coefficients $$w_n^{(k+1)} = w_n^{(k)} + \delta w_n^{(k)}, \forall n \in [0, N] \tag{12}$$

as the starting point for the (k+1)th iteration step. By way of example and not by way of limitation, the optimal perturbations $\{\delta w_n^{(k)}\}_{n=0}^{N}$ may seek to minimize the following error function, $$\sum_{m=1}^{M} \left( \sum_{n=0}^{N} \left[ \frac{WP_n(x_m, y_m)}{SL^{(k)}(x_m, y_m)} + \frac{WP_n(x'_m, y'_m)}{SL^{(k)}(x'_m, y'_m)} \right] \delta w_n^{(k)} + CDS_m - CDM_m \right)^2 \stackrel{def}{=} \|A^{(k)} \delta w^{(k)} + e^{(k)}\|_2, \tag{13}$$

where $e^{(k)} = [CDS_1 - CDM_1, CDS_2 - CDM_2, \ldots, CDS_M - CDM_M]^T$ is an M-dimensional column vector of CD fitting errors, $\delta w^{(k)} = [\delta_0^{(k)}, \delta w_1^{(k)}, \ldots, \delta w_N^{(k)}]^T$ is an (N+1)-dimensional column vector of perturbations to the Wiener coefficients, and $A^{(k)}$ is a linear operator represented in a matrix form $A^{(k)} = [A_{mn}^{(k)}]_{mn}$ with $$A_{mn}^{(k)} = \frac{WP_n(x_m, y_m)}{SL^{(k)}(x_m, y_m)} + \frac{WP_n(x'_m, y'_m)}{SL^{(k)}(x'_m, y'_m)}, \tag{14}$$

$$\forall m \in [1, M], \quad \forall n \in [0, N].$$

Note that both $CDS_m^{(k)}$ and the slopes $SL^{(k)}(x_m, y_m)$, $SL^{(k)}(x'_m, y'_m)$ depend on the initial Wiener coefficients $\{w_n^{(k)}\}_{n=0}^{N}$ available at the beginning of the kth iteration step. They are just computed at the beginning and deemed constants for the remaining of the kth iteration step, so to obtain a linearized formulation as in equation (13).

Exactly in the standard form of the projected Landweber method (See, for example, M. Piana and M. Bertero, "Projected Landweber method and preconditioning," *Inverse Problems*, vol. 13, pp. 441-463, 1997), the optimization problem represented by equation (13) is known to be solved optimally by the following iterative formula, $$\delta w^{(k)} = w^{(k+1)} - w^{(k)} = -\tau [A^{(k)}]^\dagger e^{(k)}, \forall k \geq 0, \tag{15}$$

that is, $$w^{(k+1)} = w^{(k)} - \tau [A^{(k)}]^\dagger e^{(k)}, \forall k \geq 0, \tag{16}$$

where $[A^{(k)}]^\dagger$ denotes the conjugate operator (matrix) of $A^{(k)}$, and $\tau > 0$ is a "damping" or "gain" coefficient that is suitably chosen to avoid large oscillations in the iterative numerical procedure while achieving the fastest convergence. In practice, it may be preferred to have the Wiener coefficients constrained, for example, by linear inequalities, so that the desired solutions live in a (usually convex) set $\mathcal{C}$. In which case, the iterative formula becomes, $$w^{(k+1)} = P\mathcal{C} [w^{(k)} - \tau [A^{(k)}]^\dagger e^{(k)}], \forall k \geq 0, \tag{17}$$

where $P\mathcal{C}$ is a projection operator onto the admissible set $\mathcal{C}$.

Similarly, Wiener nonlinear models may be adopted to simulate the process of wet or plasma etching of a silicon wafer coated with developed resist. Input to the Wiener models may be sets of contour curves describing the boundary of resist structures at different depths. The output from each Wiener model may be a 2D signal distribution, which after a threshold step gives contours delineating edges or walls of 3D structures of etched silicon, at a specific depth.

Furthermore, the process of (vectorial) light scattering by a 3D thick-mask may be formulated into a Wiener model, where the 3D photomask may be described as consisting of multiple slices of materials, with each slice being specified by a 2D distribution (discretely or continuously valued) of materials, or more precisely, of physical parameters such as dielectric constants, light absorption coefficients, densities of electron gas, and electrical conductivities, etc. The collection of such 2D distributions would be the input to the Wiener model, while the diffracted light field is the output. The (usually nonlinear) functional relationship between the input and output signals is of course represented by convolving the input signal with a set of predetermined Wiener kernels, then computing, weighting, and summing nonlinear products of the convolution results. The Wiener model, namely the Wiener coefficients, may be calibrated by simulated diffraction results using a rigorous differential method, such as the finite element method, or the finite difference time domain method. Once calibrated, the Wiener model may be used to quickly predict the diffraction field of a large piece of 3D thick-mask, by virtue of fast kernel-signal convolutions using fast Fourier transform. It is noted that a Wiener model of 3D mask may have Wiener coefficients expressed as functions, e.g., as low-order multi-variable polynomials, of mask material and topographic parameters.

What is claimed is:

1. A method for simulating a resist processing system according to a Wiener nonlinear model thereof, comprising:
    receiving a plurality of precomputed optical intensity distributions corresponding to a respective plurality of distinct elevations in an optically exposed resist film;
    convolving each of said optical intensity distributions with each of a plurality of predetermined Wiener kernels to generate a plurality of convolution results;
    cross-multiplying at least two of said convolution results to produce at least one cross-product;
    computing a first weighted summation of said plurality of convolution results and said at least one cross-product using a respective first plurality of predetermined Wiener coefficients to generate a first Wiener output; and
    generating a resist processing system simulation result based at least in part on said first Wiener output.

2. The method of claim 1, wherein said generating the resist processing system simulation result comprises thresholding said first Wiener output by a predetermined first threshold value to produce a contour plot representing a developed version of the resist film at a first level.

3. The method of claim 1, further comprising computing a second weighted summation of said plurality of convolution results and said at least one cross-product using a respective second plurality of predetermined Wiener coefficients to generate a second Wiener output, wherein said resist processing system simulation result is further based at least in part on said second Wiener output.

4. The method of claim 3, wherein said generating the resist processing system simulation result comprises thresholding said first and second Wiener outputs by predetermined first and second threshold values, respectively, to produce a contour plot representing a developed version of the resist film at each of a first level and a second level, respectively.

5. The method of claim 1, wherein said at least one cross product includes at least one third-order cross-product.

6. The method of claim 1, wherein said generating the resist processing system simulation result comprises processing said first Wiener output within at least one predefined lateral region of interest to produce at least one value representing a dimension of a processed resist pattern.

7. The method of claim 1, the Wiener nonlinear model of the resist processing system being applicable across a wafer area, the wafer area including a plurality of predefined laterally distinct regions of interest (ROIs), wherein said generating said resist processing system simulation result comprises processing said first Wiener output for each of said plurality of ROIs to generate a respective plurality of values representing dimensions of a processed resist pattern.

8. The method of claim 7, each said ROI being at least three orders of magnitude smaller than said wafer area, said Wiener kernels being sized according to a lateral ambit of the resist processing system, the lateral ambit being at least three orders of magnitude smaller than said wafer area, wherein said convolving is spatially limited to each said ROI and a neighborhood therearound larger than said lateral ambit but at least two orders of magnitude smaller than said wafer area, and wherein said cross-multiplying and said first weighted summation are each spatially limited to each said ROI such that said first Wiener output is generated only within each said ROI, said spatial limitations reducing an overall number of computations required for the resist processing system simulation.

9. A method for calibrating a plurality of Wiener coefficients for use in a Wiener nonlinear model-based computer simulation of a resist processing system, comprising:
    receiving first information representative of a reference developed resist structure associated with a test mask design;
    receiving second information representative of a plurality of precomputed optical intensity distributions corresponding to respective distinct elevations of an optical exposure pattern associated with said test mask design;
    convolving each of said optical intensity distributions with each of a plurality of predetermined Wiener kernels to generate a plurality of convolution results;
    cross-multiplying at least two of said convolution results to produce at least one cross-product;
    initializing the plurality of Wiener coefficients;
    computing with a processing system a weighted summation of said plurality of convolution results and said at least one cross-product using said plurality of Wiener coefficients to generate a current Wiener output;
    processing said current Wiener output to generate third information representative of a current virtual developed resist structure;
    modifying said plurality of Wiener coefficients based on said first information and said third information; and
    repeating said computing the weighted summation, said processing the current Wiener output, and said modifying the plurality of Wiener coefficients until a small error condition is reached between said third information and said first information to produce the calibrated Wiener coefficients.

10. The method of claim 9, further comprising generating said first information using a physical version of the resist processing system, said generating said first information comprising:

exposing a physical resist film disposed on a wafer using a physical optical exposure system and a physical test mask based on said test mask design; and physically processing the exposed physical resist film using said physical version of the resist processing system to generate said reference developed resist structure.

11. The method of claim 10, wherein said generating said first information further comprises measuring a plurality of dimensions of said reference developed resist structure for a respective plurality of laterally distinct regions of interest (ROIs) thereacross, and wherein said processing said current Wiener output to generate said third information comprises determining a plurality of dimensions corresponding to said current virtual developed resist structure for a respective plurality of ROIs thereacross corresponding in location to said plurality of ROIs of said reference developed resist structure.

12. The method of claim 11, the Wiener nonlinear model of the resist processing system being applicable across a wafer area, each said ROI being at least three orders of magnitude smaller than said wafer area, wherein said cross-multiplying and said weighted summation are each spatially limited to each said ROI such that said current Wiener output is generated only within each said ROI.

13. The method of claim 11, wherein said modifying said plurality of Wiener coefficients based on said first information and said third information comprises a iterative numerical algorithm.

14. The method of claim 9, further comprising generating said first information representative of the reference developed resist structure, wherein said generating said first information comprises:

receiving said second information representative of the plurality of precomputed optical intensity distributions; and processing said plurality of precomputed optical intensity distributions using an antecedent simulation of the resist processing system to generate an antecedent simulator output; and extracting said first information from said antecedent simulator output.

15. The method of claim 14, wherein said antecedent simulation of the resist processing system is selected from a group consisting of:

differential-equation-solving simulators, finite difference simulators, finite element simulators, and closed-form model simulators.

16. The method of claim 14, wherein said at least one cross product includes a highest-order cross-product having an order $ORD_W > 2$, and wherein said antecedent simulation of the resist processing system is based on a Wiener nonlinear model incorporating an antecedent convolution result cross-product computation having a highest order $ORD_{ANTECEDENT}$ that is less than $ORD_W$.

17. The method of claim 14, wherein said extracting said first information from said antecedent simulator output generates a plurality of dimensions of said reference developed resist structure for a respective plurality of laterally distinct regions of interest (ROIs) thereacross, and wherein said processing said current Wiener output to generate said third information comprises determining a plurality of dimensions corresponding to said current virtual developed resist structure for a respective plurality of ROIs thereacross corresponding in location to said plurality of ROIs of said reference developed resist structure.

18. The method of claim 17, the Wiener nonlinear model of the resist processing system being applicable across a wafer area, each said ROI being at least three orders of magnitude smaller than said wafer area, wherein said cross-multiplying and said weighted summation are each spatially limited to each said ROI such that said current Wiener output is generated only within each said ROI.

19. A method for simulating an etch system according to a Wiener nonlinear model thereof, comprising:

receiving first information representative of a plurality of precomputed developed resist distributions corresponding to a respective plurality of distinct elevations in a developed resist structure disposed on a wafer;

convolving each of said developed resist distributions with each of a plurality of predetermined Wiener kernels to generate a plurality of convolution results;

cross-multiplying at least two of said convolution results to produce at least one cross-product;

computing a first weighted summation of said plurality of convolution results and said at least one cross-product using a respective first plurality of predetermined Wiener coefficients to generate a first Wiener output; and generating an etch system simulation result based at least in part on said first Wiener output.

20. The method of claim 19, wherein said generating the etch system simulation result comprises thresholding said first Wiener output by a predetermined first threshold value to produce a contour plot representing an etched version of the wafer at a first level.

21. The method of claim 19, further comprising computing a second weighted summation of said plurality of convolution results and said at least one cross-product using a respective second plurality of predetermined Wiener coefficients to generate a second Wiener output, wherein said etch system simulation result is further based at least in part on said second Wiener output.

22. The method of claim 21, wherein said generating the etch system simulation result comprises thresholding said first and second Wiener outputs by predetermined first and second threshold values, respectively, to produce a contour plot representing an etched version of the wafer at each of a first level and a second level, respectively.

23. The method of claim 19, wherein said at least one cross product includes at least one third-order cross-product.

24. The method of claim 19, wherein said generating the etch system simulation result comprises processing said first Wiener output within at least one predefined lateral region of interest to produce at least one value representing a dimension of a processed resist pattern.

25. A method for calibrating a plurality of Wiener coefficients for use in a Wiener nonlinear model-based computer simulation of an etch system, comprising:

receiving first information representative of a reference etched wafer structure associated with a precomputed test developed resist structure;

receiving second information representative of a plurality of developed resist distributions corresponding to a respective plurality of distinct elevations in the precomputed test developed resist structure;

convolving each of said developed resist distributions with each of a plurality of predetermined Wiener kernels to generate a plurality of convolution results;

cross-multiplying at least two of said convolution results to produce at least one cross-product;

initializing the plurality of Wiener coefficients;

computing with a processing system a weighted summation of said plurality of convolution results and said at least one cross-product using said plurality of Wiener coefficients to generate a current Wiener output;

processing said current Wiener output to generate third information representative of a current virtual etched wafer structure;

modifying said plurality of Wiener coefficients based on said first information and said third information; and repeating said computing the weighted summation, said processing the current Wiener output, and said modifying the plurality of Wiener coefficients until a small error condition is reached between said third information and said first information to produce the calibrated Wiener coefficients.

26. The method of claim 25, further comprising generating said first information representative of the reference etched wafer structure, wherein said generating said first information comprises:

receiving said second information representative of the plurality of developed resist distributions; and processing said plurality of developed resist distributions using an antecedent simulation of the etch system to generate an antecedent simulator output; and extracting said first information from said antecedent simulator output.

27. The method of claim 26, wherein said antecedent simulation of the etch system is selected from a group consisting of: differential-equation-solving simulators, finite difference simulators, finite element simulators, and closed-form model simulators.

28. The method of claim 26, wherein said at least one cross product includes a highest-order cross-product having an order $ORD_W>2$, and wherein said antecedent simulation of the etch system is based on a Wiener nonlinear model incorporating an antecedent convolution result cross-product computation having a highest order $ORD_{ANTECEDENT}$ that is less than $ORD_W$.

29. The method of claim 26, wherein said extracting said first information from said antecedent simulator output generates a plurality of dimensions of said reference etched wafer structure for a respective plurality of laterally distinct regions of interest (ROIs) thereacross, and wherein said processing said current Wiener output to generate said third information comprises determining a plurality of dimensions corresponding to said current virtual etched wafer structure for a respective plurality of ROIs thereacross corresponding in location to said plurality of ROIs of said reference etched wafer structure.

30. A method for simulating a resist processing system, comprising:

receiving a plurality of precomputed optical intensity distributions corresponding to a respective plurality of distinct elevations in an optically exposed resist film;

filtering of each of said optical intensity distributions with each of a plurality of predetermined filters to generate a plurality of filtering results, said predetermined filters corresponding to a closed-form mathematical model of the resist processing system;

computing at least one nonlinear function of at least two of said filtering results to produce at least one nonlinear result;

computing a weighted combination of said plurality of filtering results and said at least one nonlinear result using a respective plurality of predetermined weighting coefficients associated with said closed-form mathematical model to generate a model output; and generating a resist processing system simulation result based at least in part on said model output.

31. A method for calibrating a plurality of weighting coefficients for use in a closed-form mathematical model-based computer simulation of a resist processing system, comprising:

receiving first information representative of a reference developed resist structure associated with a test mask design;

receiving second information representative of a plurality of precomputed optical intensity distributions corresponding to respective distinct elevations of an optical exposure pattern associated with said test mask design;

filtering of each of said optical intensity distributions with each of a plurality of predetermined filters associated with said closed-form mathematical model to generate a plurality of filtering results;

computing with a processing system at least one nonlinear function of at least two of said filtering results to produce at least one nonlinear result;

initializing the plurality of weighting coefficients;

computing a weighted combination of said plurality of filtering results and said at least one nonlinear result using said plurality of weighting coefficients to generate a current model output;

processing said current model output to generate third information representative of a current virtual developed resist structure;

modifying said plurality of weighting coefficients based on said first information and said third information; and repeating said computing the weighted summation, said processing the current model output, and said modifying the plurality of weighting coefficients until a small error condition is reached between said third information and said first information to produce the calibrated weighting coefficients.

32. A method for simulating an etch system, comprising:

receiving first information representative of a plurality of precomputed developed resist distributions corresponding to a respective plurality of distinct elevations in a developed resist structure disposed on a wafer;

filtering of each of said developed resist distributions with each of a plurality of predetermined filters to generate a plurality of filtering results, said predetermined filters corresponding to a closed-form mathematical model of the etch system;

computing with a processing system at least one nonlinear function of at least two of said filtering results to produce at least one nonlinear result;

computing a first weighted combination of said plurality of filtering results and said at least one nonlinear result using a respective plurality of predetermined weighting coefficients to generate a model output; and generating an etch system simulation result based at least in part on said model output.

33. A method for calibrating a plurality of weighting coefficients for use in a closed-form mathematical model-based computer simulation of an etch system, comprising:

receiving first information representative of a reference etched wafer structure associated with a precomputed test developed resist structure;

receiving second information representative of a plurality of developed resist distributions corresponding to a respective plurality of distinct elevations in the precomputed test developed resist structure;

filtering each of said developed resist distributions with each of a plurality of predetermined filters associated with said closed-form mathematical model to generate a plurality of filtering results;

computing with a processing system at least one nonlinear function of at least two of said filtering results to produce at least one nonlinear result;
initializing the plurality of weighting coefficients;
computing a weighted summation of said plurality of filtering results and said at least one nonlinear result using said plurality of weighting coefficients to generate a current model output;
processing said current model output to generate third information representative of a current virtual etched wafer structure;
modifying said plurality of weighting coefficients based on said first information and said third information; and
repeating said computing the weighted summation, said processing the current model output, and said modifying the plurality of weighting coefficients until a small error condition is reached between said third information and said first information to produce the calibrated weighting coefficients.

34. A method for simulating an optical exposure system in which optical radiation incident upon a photomask is modulated thereby and projected toward a target to generate a target intensity pattern, the optical radiation incident upon the photomask comprising a plurality of spatial frequency components, the method comprising:
receiving a plurality of mask layer distribution functions representative of a respective plurality of layers of the photomask;
receiving first information representative of a first of the plurality of spatial frequency components of the incident optical radiation;
convolving each of said mask layer distribution functions with each of a plurality of predetermined Wiener kernels to generate a plurality of convolution results;
cross-multiplying at least two of said convolution results to produce at least one cross-product;
computing a first weighted summation of said plurality of convolution results and said at least one cross-product using a respective first plurality of predetermined Wiener coefficients to generate a first Wiener output representative of a first modulated radiation result associated with said first spatial frequency component; and
generating a target intensity pattern based at least in part on said first modulated radiation result.

35. The method of claim 34, further comprising:
receiving second information representative of a second of the plurality of spatial frequency components of the incident optical radiation; and
computing a second weighted summation of said plurality of convolution results and said at least one cross-product using a respective second plurality of predetermined Wiener coefficients to generate a second Wiener output representative of a second modulated radiation result associated with said second spatial frequency component;
wherein said target intensity pattern is further based at least in part on said second modulated radiation result.

36. The method of claim 35, further comprising:
processing said first modulated radiation result according to a projection simulation algorithm to generate a first target partial intensity distribution corresponding thereto;
processing said second modulated radiation result according to said projection simulation algorithm to generate a second target partial intensity distribution corresponding thereto; and
computing said target intensity pattern as a sum of said first and second target partial intensity distributions.

37. A method for calibrating a plurality of Wiener coefficients for use in a Wiener nonlinear model-based computer simulation of photomask diffraction of incident optical radiation at a selected spatial frequency, comprising:
receiving first information representative of a reference modulated radiation result associated with a test photomask and said selected spatial frequency;
receiving a plurality of mask layer distribution functions representative of a respective plurality of layers of the test photomask;
convolving each of said mask layer distribution functions with each of a plurality of predetermined Wiener kernels to generate a plurality of convolution results;
cross-multiplying at least two of said convolution results to produce at least one cross-product;
initializing the plurality of Wiener coefficients;
computing with a processing system a weighted summation of said plurality of convolution results and said at least one cross-product using said plurality of Wiener coefficients to generate a current Wiener output representative of a current virtual modulated radiation result;
modifying said plurality of Wiener coefficients based on said reference modulated radiation result and said current virtual modulated radiation result; and
repeating said computing the weighted summation and said modifying the plurality of Wiener coefficients until a small error condition is reached between said current modulated radiation result and said reference modulated radiation result to produce the calibrated Wiener coefficients.

38. The method of claim 37, further comprising generating said first information representative of the reference modulated radiation result, wherein said generating said first information comprises:
receiving second information representative of said plurality of layers of the test photomask;
processing said second information using an antecedent simulation of the photomask diffraction of the incident optical radiation at said selected spatial frequency to generate said first information.

39. The method of claim 38, wherein said antecedent simulation of the photomask diffraction of the incident optical radiation at said selected spatial frequency is selected from a group consisting of: differential-equation-solving simulators, finite difference simulators, finite element simulators, and closed-form model simulators.

40. The method of claim 38, wherein said at least one cross product includes a highest-order cross-product having an order $ORD_W > 2$, and wherein said antecedent simulation is based on a Wiener nonlinear model incorporating an antecedent convolution result cross-product computation having a highest order $ORD_{ANTECEDENT}$ that is less than $ORD_W$.

41. A method for simulating a resist processing system according to a Wiener nonlinear model thereof, comprising:
receiving a plurality of precomputed optical intensity distributions corresponding to a respective plurality of distinct elevations in an optically exposed resist film;
convolving each of said optical intensity distributions with each of a plurality of predetermined Wiener kernels to generate a plurality of convolution results;
cross-multiplying at least two of said convolution results to produce at least one cross-product;
receiving a plurality of process variation factors associated with the resist processing system;

computing each of a plurality of Wiener coefficients as a respective predetermined polynomial function of said process variation factors characterized by a respective distinct set of predetermined polynomial coefficients;

computing a weighted summation of said plurality of convolution results and said at least one cross-product using said computed plurality of Wiener coefficients to generate a Wiener output; and generating a resist processing system simulation result based at least in part on said Wiener output.

42. The method of claim 41, wherein each of said predetermined polynomial functions consists essentially of a Taylor series of said process variation factors truncated at a relatively low order.

43. The method of claim 42, wherein said plurality of process variation factors includes a bake temperature variation factor and a resist development time duration variation factor.

44. A method for calibrating a plurality of sets of polynomial coefficients for use in a Wiener nonlinear model-based computer simulation of a resist processing system, comprising:

receiving first information representative of a plurality of reference developed resist structures, said reference developed resist structures being associated with a common test mask design but each said reference developed resist structure being associated with a respective one of a known plurality of distinctly valued process variation factor sets associated with the resist processing system;

receiving second information representative of a plurality of precomputed optical intensity distributions corresponding to respective distinct elevations of an optical exposure pattern associated with said common test mask design;

convolving each of said optical intensity distributions with each of a plurality of predetermined Wiener kernels to generate a plurality of convolution results;

cross-multiplying at least two of said convolution results to produce at least one cross-product;

initializing the plurality of sets of polynomial coefficients;

computing with a processing system a plurality of current Wiener outputs associated with respective ones of said distinctly valued process variation factor sets, wherein, for each distinctly valued process variation factor set, said computing the current Wiener output comprises:

computing each of a plurality of Wiener coefficients as a respective predetermined polynomial function of said process variation factors, each said predetermined polynomial function using a respective one of said sets of polynomial coefficients; and computing a weighted summation of said plurality of convolution results and said at least one cross-product using said computed plurality of Wiener coefficients to generate the current Wiener output;

processing said plurality of current Wiener outputs to generate third information representative of a respective plurality of current virtual developed resist structures;

modifying said plurality of sets of polynomial coefficients based on said first information and said third information; and repeating said computing the plurality of current Wiener outputs, said processing said plurality of current Wiener outputs, and said modifying the plurality of sets of polynomial coefficients until a small error condition is reached between said third information and said first information to produce the calibrated sets of polynomial coefficients.

45. The method of claim 44, wherein said known plurality of distinctly valued process variation factor sets comprises a plurality of distinctly valued combinations of bake temperatures and resist development time duration.

46. The method of claim 44, further comprising generating said first information representative of the plurality of reference developed resist structures, wherein said generating said first information comprises:

receiving said second information representative of the plurality of precomputed optical intensity distributions; and for each one of said distinctly valued process variation factor sets, processing said second information using an antecedent simulation of the resist processing system to generate fourth information representative of a respective one of the plurality of reference developed resist structures, said first information being based at least in part on said fourth information.

* * * * *